(12) United States Patent
Tsurume et al.

(10) Patent No.: US 7,476,575 B2
(45) Date of Patent: Jan. 13, 2009

(54) METHOD FOR MANUFACTURING THIN FILM INTEGRATED CIRCUIT

(75) Inventors: Takuya Tsurume, Kanagawa (JP); Koji Dairiki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/570,854

(22) PCT Filed: Jun. 15, 2005

(86) PCT No.: PCT/JP2005/011398

§ 371 (c)(1),
(2), (4) Date: Dec. 18, 2006

(87) PCT Pub. No.: WO2006/001287

PCT Pub. Date: Jan. 5, 2006

(65) Prior Publication Data

US 2007/0212875 A1    Sep. 13, 2007

(30) Foreign Application Priority Data

Jun. 24, 2004    (JP)    ............ 2004-186543

(51) Int. Cl.
*H01L 21/00*    (2006.01)
(52) U.S. Cl. ............... 438/149; 438/458; 257/E21.535; 257/E21.602
(58) Field of Classification Search ........... 438/149, 438/458; 257/E21.535, E21.602
See application file for complete search history.

(56) References Cited

U.S. PATENT DOCUMENTS 5,757,456 A    5/1998    Yamazaki et al.

(Continued)

FOREIGN PATENT DOCUMENTS

EP    1 455 394 A1    9/2004

(Continued)

OTHER PUBLICATIONS

Yu-Cheng Chen et al.; "Lateral Etching and Separating Device Transfer Technology for Flexible Display and Electronic Applications"; *AM-LCD '04*; pp. 313-316; 2004.

(Continued)

*Primary Examiner*—Trung Dang
(74) *Attorney, Agent, or Firm*—Fish & Richardson P.C.

(57) ABSTRACT

An object of the present invention is to prevent a thin film integrate circuit from peeling off during the process of transferring to a base material. By a manufacturing method of the present invention, a separation layer is formed selectively on a surface of a substrate; thus, a first region where the separation layer is provided and a second region where the separation layer is not provided are formed. A thin film integrated circuit is formed over the separation layer. Then, an opening portion for exposing the separation layer is formed, en etching agent is introduced into the opening portion to remove the separation layer. Thus, a space is generated in the region provided with the separation layer, whereas a space is not generated in the region without the separation layer. Therefore, the thin film integrated circuit can be prevented from peeling off even after the separation layer is removed, by providing the region where the space is not generated after that.

10 Claims, 17 Drawing Sheets

U.S. PATENT DOCUMENTS

| | | | |
|---|---|---|---|
| 6,118,502 | A | 9/2000 | Yamazaki et al. |
| 6,887,650 | B2 | 5/2005 | Shimoda et al. |
| 7,050,138 | B1 | 5/2006 | Yamazaki et al. |
| 7,112,952 | B2 * | 9/2006 | Arai et al. ............... 324/158.1 |
| 7,122,445 | B2 | 10/2006 | Takayama et al. |
| 7,189,631 | B2 | 3/2007 | Yamazaki et al. |
| 7,229,900 | B2 | 6/2007 | Takayama et al. |
| 7,241,666 | B2 | 7/2007 | Goto et al. |
| 7,282,380 | B2 | 10/2007 | Maruyama et al. |
| 2001/0015256 | A1 | 8/2001 | Yamazaki et al. |
| 2003/0022403 | A1 | 1/2003 | Shimoda et al. |
| 2003/0071953 | A1 | 4/2003 | Yamazaki et al. |
| 2004/0164302 | A1 * | 8/2004 | Arai et al. |
| 2004/0245525 | A1 * | 12/2004 | Yamazaki et al. |
| 2005/0070038 | A1 | 3/2005 | Yamazaki et al. |
| 2005/0106839 | A1 | 5/2005 | Shimoda et al. |
| 2005/0287846 | A1 | 12/2005 | Dozen et al. |
| 2007/0032042 | A1 | 2/2007 | Takayama et al. |
| 2007/0158745 | A1 | 7/2007 | Yamazaki et al. |
| 2007/0161159 | A1 * | 7/2007 | Yamazaki et al. ............ 438/149 |
| 2007/0176622 | A1 * | 8/2007 | Yamazaki .................... 324/770 |
| 2007/0218650 | A1 | 9/2007 | Yamazaki et al. |

FOREIGN PATENT DOCUMENTS

| | | |
|---|---|---|
| JP | 08-254686 | 10/1996 |
| WO | WO 03/010825 A1 | 2/2003 |
| WO | WO05-076358 | 8/2005 |

OTHER PUBLICATIONS

International Search Report (Application No. PCT/JP2005/011398) dated Sep. 27, 2005.

Written Opinion (Application No. PCT/JP2005/011398) dated Sep. 27, 2005.

* cited by examiner

METHOD FOR MANUFACTURING THIN FILM INTEGRATED CIRCUIT

TECHNICAL FIELD

The present invention relates to a method for manufacturing a thin film integrated circuit.

BACKGROUND ART

In recent years, technology for transferring a thin film integrated circuit formed on an insulating substrate has been developed. According to such a technology, for example, by providing a separation layer between a thin film integrated circuit and a substrate and removing the separation layer by a gas containing halogen, the thin film integrated circuit is separated from the supporting substrate and then transferred. (For example, Reference 1: Japanese Patent Laid-Open No. H8-254686).

DISCLOSURE OF INVENTION

According to Reference 1, a separation layer is formed on one side of a surface of a substrate, and a thin film integrated circuit is formed over the separation layer. Then, the separation layer is removed. Thus, the thin film integrated circuit is separated from the substrate, and a space is generated between the substrate and the thin film integrated circuit. After that, the thin film integrated circuit is attached onto a base material. The thin film integrated circuit is very thin with thickness of several μm and is extremely light. Therefore, there is a problem that the thin film integrated circuit peels off from the substrate before being attached onto the base material. In view of the problem, it is an object of the present invention to prevent the thin film integrated circuit from peeling off. Further, it is another object of the present invention to easily transfer the thin film integrated circuit onto the base material after removing the separation layer.

According to the present invention, after a separation layer is formed on a surface of a substrate, the separation layer is selectively removed. Thus, a first region in which the separation layer is provided and a second region in which the separation layer is not provided are formed. Subsequently, an insulating film as a base film is formed over the whole surface. Consequently, the insulating film is in contact with the separation layer in the first region, and is in contact with the substrate in the second region.

A thin film integrated circuit including a plurality of elements and a conductive layer serving as an antenna is formed over the insulating film in the first region. Then an opening portion is formed, and the separation layer is removed by introducing an etching agent into the opening portion. In this case, a space is generated between the substrate and the insulating film in the first region in which the separation layer is provided, whereas the substrate and the insulating film are in contact with each other in the second region in which the separation layer is not provided.

Therefore, even after the separation layer is removed, the thin film integrated circuit provided over the insulating film can be prevented from peeling off by providing a region in which the substrate and the insulating film are in contact with each other. The thin film integrated circuit can be held by the substrate, and the thin film integrated circuit can be easily transferred onto a base material by providing the region in which the substrate and the insulating film are in contact with each other.

A method for manufacturing a thin film integrated circuit according to the present invention, comprising the steps of: forming a separation layer in a first region and a second region over a substrate having an insulating surface; removing only the separation layer in the second region; forming an insulating film in contact with the insulating substrate and the separation layer; forming a plurality of elements and a conductive layer serving as an antenna over the insulating film in the first region; forming selectively an opening portion to expose the separation layer in a region where the plurality of elements and the conductive layer are not formed; and removing the separation layer by introducing an etching agent into the opening portion.

A method for manufacturing a thin film integrated circuit according to the present invention, comprising the steps of: forming a separation layer in a third region and a fourth region over a substrate having an insulating surface; removing selectively the separation layer in the third region; removing the separation layer in the fourth region; forming an insulating film to be in contact with the insulating substrate and the separation layer; forming a plurality of elements and a conductive layer serving as antenna over the insulating film in the third region; forming selectively an opening portion in a sixth region in the periphery of the fifth region in which the plurality of elements and the conductive layer have been formed, so as to expose the separation layer; and removing the separation layer by introducing an etching agent into the opening portion, wherein, in the step of removing selectively the separation layer in the third region, the separation layer in a seventh region other than the fifth and sixth regions included in the third region is removed but the separation layer in the fifth and sixth regions is not removed.

A method for manufacturing a thin film integrated circuit according to the present invention, comprising the steps of: forming a separation layer in a third region and a fourth region over a substrate having an insulating surface; removing selectively the separation layer in the third region; removing the separation layer in the fourth region; forming an insulating film to be in contact with the substrate and the separation layer; forming a plurality of elements and a conductive layer serving as antenna over the insulating film in the third region; forming an opening portion in a sixth region other than a fifth region in which the plurality of elements and the conductive layer have been formed, and a eighth region in the periphery of the fifth region, so as to expose the separation layer; and removing the separation layer by introducing an etching agent into the opening portion, wherein, in the step of removing selectively the separation layer of the third region, the separation layer in the eighth region included in the third region is selectively removed but the separation layer in the fifth and sixth regions is not removed.

A method for manufacturing a thin film integrated circuit according to the present invention, comprising the steps of: forming a separation layer in a third region and a fourth region over a substrate having an insulating surface; removing selectively the separation layer in the third region; removing the separation layer in the fourth region; forming an insulating film to be in contact with the substrate and the separation layer; forming a plurality of elements and a conductive layer serving as antenna over the insulating film in the third region; forming selectively an opening portion in a tenth region other than a ninth region in which the plurality of elements and the conductive layer are formed, so as to expose the separation layer; and removing the separation layer by introducing an etching agent into the opening portion, wherein, in the step of removing selectively the separation layer in the third region, the separation layer in the ninth region included in the third region is selectively removed, but the separation layer outside the ninth region is not removed.

In the manufacturing methods of a thin film integrated circuit having the above described structures, "the step of forming a separation layer in first and second regions over a substrate having an insulating surface and removing the separation layer in the second region" may be changed to "the step of forming a separation layer in first and eleventh regions over a substrate having an insulating surface and selectively removing the separation layer in the eleventh region". Similarly, "the step of forming a separation layer in third and fourth regions over a substrate having an insulating surface, selectively removing the separation layer in the third region and removing the separation layer in the fourth region" may be changed to "the step of forming a separation layer in third and twelfth regions over a substrate having an insulating surface and selectively removing the separation layer in the third and twelfth region". Further, the etching agent is a gas or a liquid containing halogen fluoride.

According to the present invention, even after the separation layer is removed, a thin film integrated circuit that has been over the insulating film is prevented from peeling off by providing a region where the substrate is in contact with the insulating film. In addition, the thin film integrated circuit can be easily transferred onto a base material because the thin film integrated circuit can be held by the substrate by providing the region where the substrate is in contact with the insulating film.

When the thin film integrated circuit is held by the substrate according to the present invention, the substrate can be transferred with the thin film integrated circuit held thereover, and thus can be applied to a mass-production apparatus including a transporting means. For example, when the substrate holding a thin film integrated circuit is transferred into a laminate device, a laminating process of the thin film integrated circuit can be conducted continuously.

According to the above described structures, the first region with one unit of a thin film integrated circuit and the second region are formed separately. Only a predetermined thin film integrated circuit can be transferred onto a base material.

Since the first region and the second region are formed separately in one thin film integrated circuit as a unit, it is unnecessary that a plurality of thin film integrated circuits are sectioned after removing the separation layer. In other words, the plurality of thin film integrated circuits have been already sectioned when the thin film integrated circuits are transferred onto a base material.

BEST MODE FOR CARRYING OUT THE INVENTION

Figure 1A:
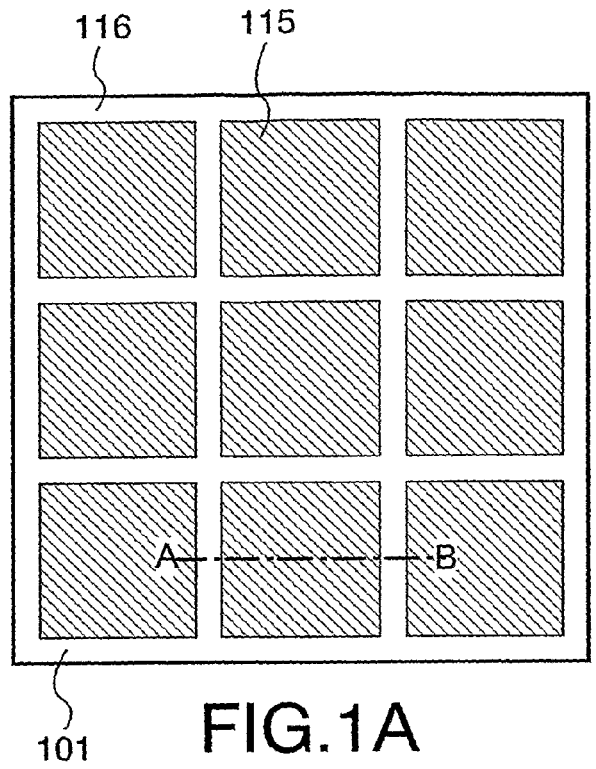
FIGS. 1A to 1C show a manufacturing method of a thin film integrated circuit according to the present invention.

Embodiment Mode and Embodiments according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment mode and embodiments to be given below. Note that the same reference numerals are used for the same portions through all drawings in the following structures according to the present invention.

Embodiment Mode

As for the manufacturing method of a thin film integrated circuit according to the present invention, four manufacturing methods are, for example, described with reference to the drawings.

A first manufacturing method is described with reference to FIGS. 1A to 1C and 2A to 2D.

A separation layer is formed on one surface of a substrate having an insulating surface 101. Then, the separation layer is selectively removed to form a first region 115 where the separation layer is provided and a second region 116 where the separation layer is removed (FIG. 1A). In the first region 115 provided with the separation layer, a thin film integrated circuit is to be formed later. The second region 116 where the separation layer is removed becomes a region where the substrate 101 is in contact with an insulating film to be formed later, without being provided with a thin film integrated circuit therein.

According to the present invention, the first region 115 and the second region 116 are formed separately in one thin film integrated circuit as a unit, and thus only a desired thin film integrated circuit can be transferred onto a base material. Further, since the first region 115 and the second region 116 are formed separately in one thin film integrated circuit as a unit, the plurality of thin film integrated circuits are each sectioned automatically by the step of transferring them onto a base material. Thus, the step of sectioning the plurality of thin film integrated circuits can be omitted.

The substrate having an insulating surface 101 corresponds to a glass substrate; a quartz substrate; a plastic substrate; a flexible synthetic resin substrate such as acrylic; or a metal substrate. In addition, the separation layer is obtained by forming a layer containing silicon by a known method such as sputtering or plasma CVD. The layer containing silicon corresponds to an amorphous semiconductor layer, a semiamorphous semiconductor layer in which an amorphous state and a crystalline state are mixed, or a crystalline semiconductor layer.

A photolithography process may be adopted to selectively remove the separation layer. As described above, the separation layer is formed over a whole surface of one side of the substrate 101, and the separation layer is removed selectively. However, the present invention is not limited to this. The separation layer may be selectively formed over the substrate 101 with a mask such as a metal mask.

Then, the following steps are described with reference to FIGS. 1A to 1C and 2A to 2D. The line A-B in FIGS. 1A to 1C corresponds to the line A-B in the cross sectional view of FIGS. 2A to 2D.

Figure 1B:
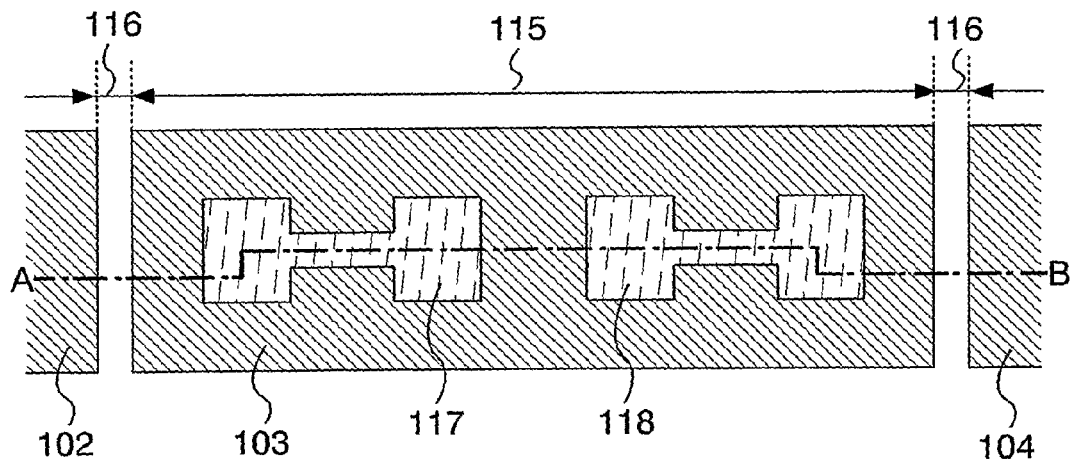
Figure 2A:
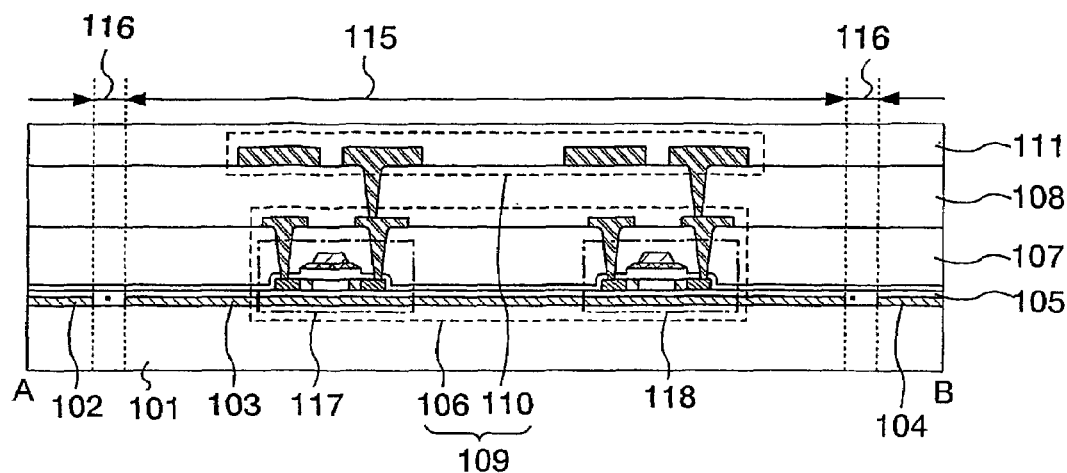
FIGS. 2A to 2D show a manufacturing method of a thin film integrated circuit according to the present invention.

An insulating film 105 is formed as a base film to be in contact with the substrate 101 and separation layers 102 to 104 (FIG. 1B and FIG. 2A). The insulating film 105 is in contact with the separation layers 102 to 104 in the first region 115 and with the substrate 101 in the second region 116. The insulating film 105 is formed from silicon oxide, silicon nitride, silicon oxynitride, silicon nitride oxide or the like by a known method such as plasma CVD or sputtering.

Subsequently, a plurality of elements (an element group) 106 including is formed over the insulating film 105 in the first region 115. The plurality of elements 106 includes, for example, one or a plurality of kinds of a thin film transistor, a capacitor element, a resistor element, a diode and the like. Here, two transistors 117 and 118 are formed in the plurality of elements 106. Then, an insulating film 107 is formed to cover the plurality of elements 106, and an insulating film 108 is formed over the insulating film 107. Then, a conductive film serving as an antenna 110 is formed over the insulating film 108. An insulating film serving as a protective film 111 is formed over the conductive layer 110. Through the above described steps, the thin film integrated circuit 109 including the plurality of elements 106 and the conductive layer 110 is completed. Note that the top view of FIG. 1B shows only active layers of the transistor 117 and 118 as the transistors 117 and 118, not showing the conductive layer 110 and so on provided over the active layers.

The insulating films 107, 108 and 111 are formed from an organic material or an inorganic material. Polyimide, acrylic, polyamide, siloxane, epoxy and the like are adopted as the organic material. Siloxane includes a skeleton formed by the bond of silicon (Si) and oxygen (O), and an organic group containing at least hydrogen (such as an alkyl group or aromatic hydrocarbon) as a substituent. In addition, fluorine may be used as the substituent. Further, fluorine and an organic group containing at least hydrogen may be adopted as the substituent. Silicon oxide, silicon nitride, silicon oxynitride, silicon nitride oxide and the like are used as the inorganic material.

Figure 1C:
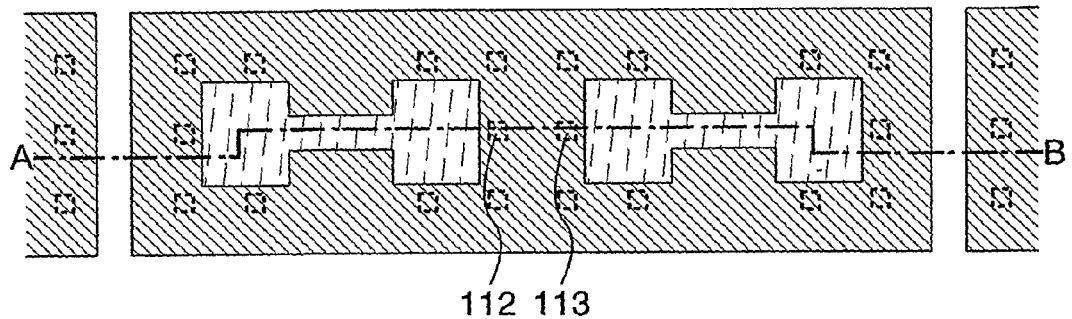
Figure 2B:
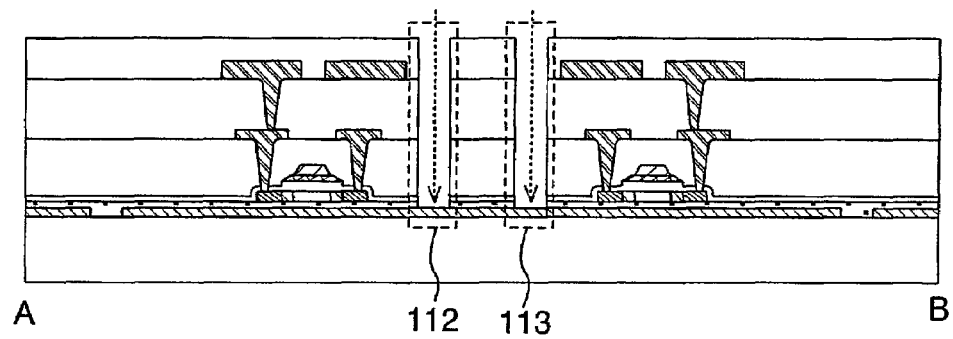

Opening portions 112 and 113 are selectively formed outside the region where the plurality of elements 106 and the conductive layer 110 are formed, so as to expose the separation layers 102 to 104 (FIG. 1C and FIG. 2B). In other words, the opening portions are selectively formed in the periphery of the region where the plurality of elements 106 and the conductive layer 110 are formed. The opening portions are formed, for example, by etching using a mask. In FIG. 1C, the opening portions are shown by a quadrangle with a dotted line.

Note that the opening portion may be formed by laser irradiation, instead of etching described above.

Figure 2C:
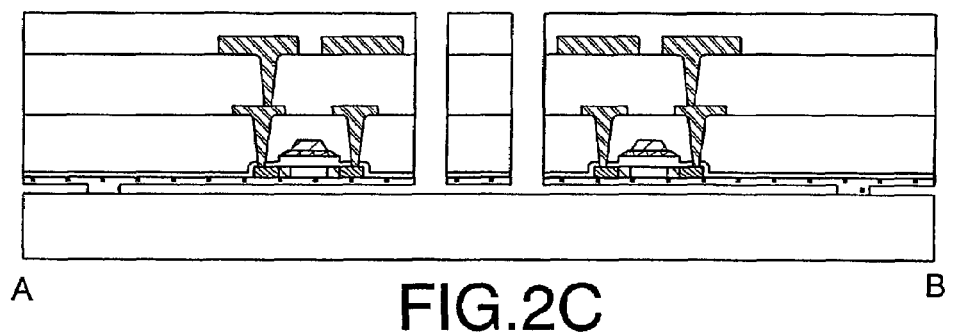

Then, an etching agent for removing the separation layers 102 to 104 is introduced into the opening portions 112 and 113 to remove the separation layers 102 to 104 (FIG. 2C). Gas or liquid containing halogen fluoride is used as the etching agent. Chlorine trifluoride ($ClF_3$) is, for example, used as the gas containing halogen fluoride.

Figure 2D:
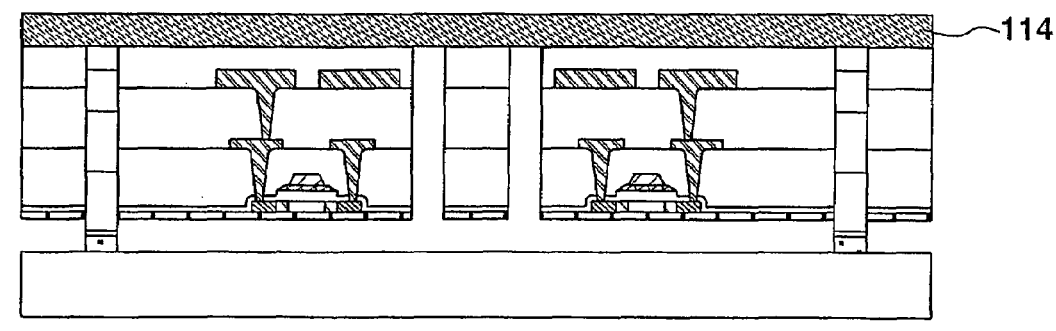
Figure 3A:
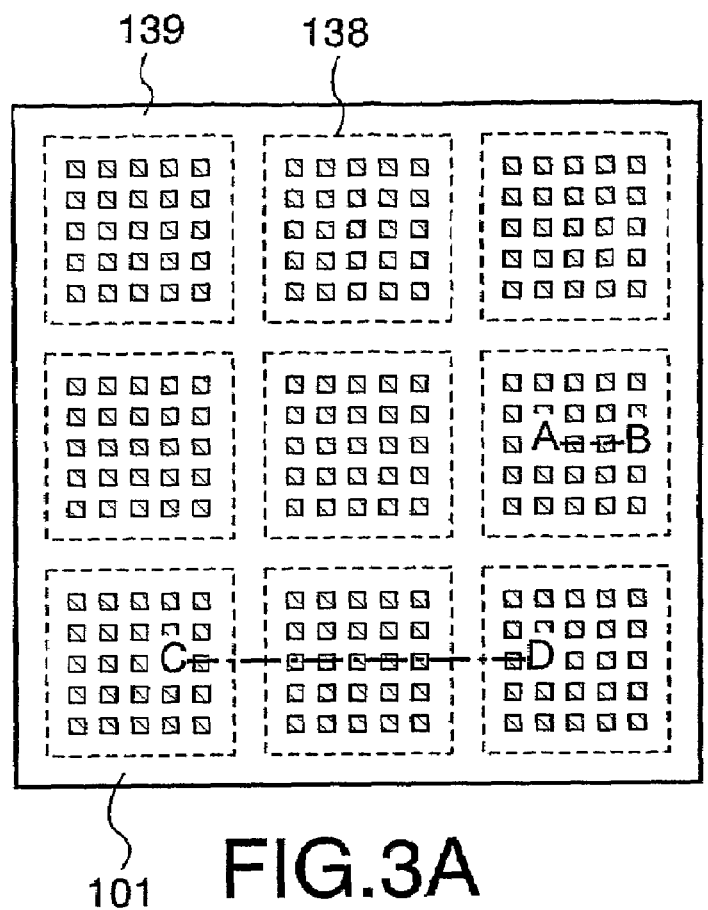
FIGS. 3A and 3B show a thin film integrated circuit according to the present invention.
Figure 3B:
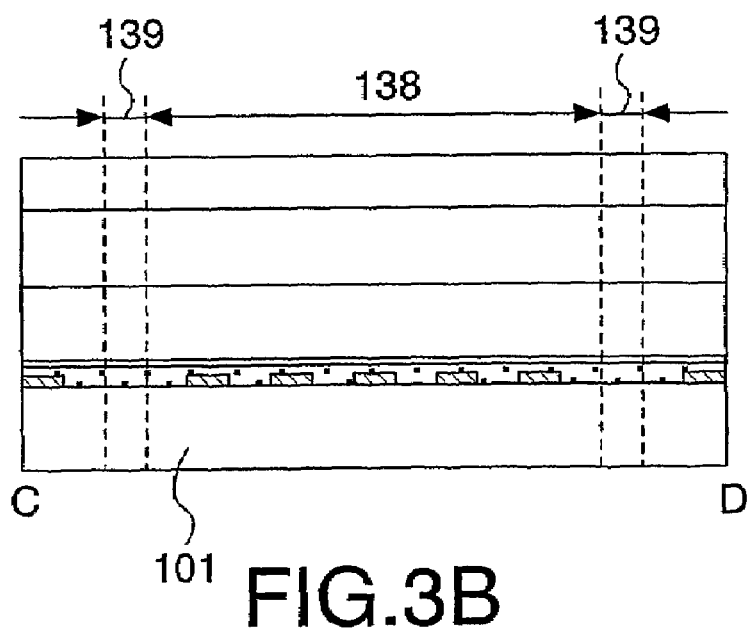

The thin film integrated circuit 109 including the plurality of elements 106 and the conductive layer 110 is attached onto a base material 114, and the thin film integrated circuit 109 is separated from the substrate 101 (FIG. 2D). At this time, a portion in which the separation layers 102 to 104 are removed is attached onto the base material 114 and is completely separated from the substrate 101, while a portion in which the substrate 101 is in contact with the insulating film 105 is held by the substrate 101.

The present invention is not limited to the above described mode. When the thin film integrated circuit 109 is attached to the base material 114, the portion in which the substrate 101 is in contact with the insulating film 105 is also attached to the base material 114 and separated from the substrate 101 in some cases.

A flexible substrate such as plastic, a two-sided tape and the like may be used as the base material 114. An adhesive surface formed with an adhesive agent such as thermosetting resin may be provided for the flexible substrate. In addition, the thin film integrated circuit may be attached onto a surface of an article without using the base material 114. As the result, an article to be provided with the thin film integrated circuit can be made thinner and lighter.

The above described method has one feature that the separation layer is selectively formed. According to the feature, since a portion of the insulating film 105 is in contact with the substrate 101 even after removing the separation layer, the thin film integrated circuit 109 can be held by the substrate 101. Thus, the thin film integrated circuit 109 can be prevented from peeling off.

A second manufacturing method is described with reference to FIGS. 3A, 3B, 4A, 4B and 5A to 5D.

A separation layer is formed on one surface of a substrate having an insulating surface 101. Then, the separation layer is selectively removed to form a third region 138 where the separation layer is selectively provided and a fourth region 139 where the separation layer is removed (FIG. 3A and FIG. 3B; the line C-D in FIG. 3A corresponds to the line C-D in FIG. 3B). In the third region 138 provided selectively with the separation layer, a thin film integrated circuit is to be formed later. The fourth region 139 where the separation layer is removed becomes a region where the substrate 101 is in contact with an insulating film to be formed later, without being provided with a thin film integrated circuit therein.

According to the present invention, the third region 138 and the fourth region 139 are formed separately in one thin film integrated circuit as a unit, and thus only a desired thin film integrated circuit can be transferred onto a base material. Further, since the third region 138 and the fourth region 139 are formed separately in one thin film integrated circuit as a unit, the plurality of thin film integrated circuits are each sectioned automatically by the step of transferring them onto a base material. Thus, the step of sectioning the plurality of thin film integrated circuits can be omitted.

Then, the following steps are described with reference to FIGS. 4A and 4B and 5A to 5D. The line A-B in FIGS. 3A, 4A and 4B corresponds to the line A-B in FIGS. 5A to 5D.

Figure 4A:
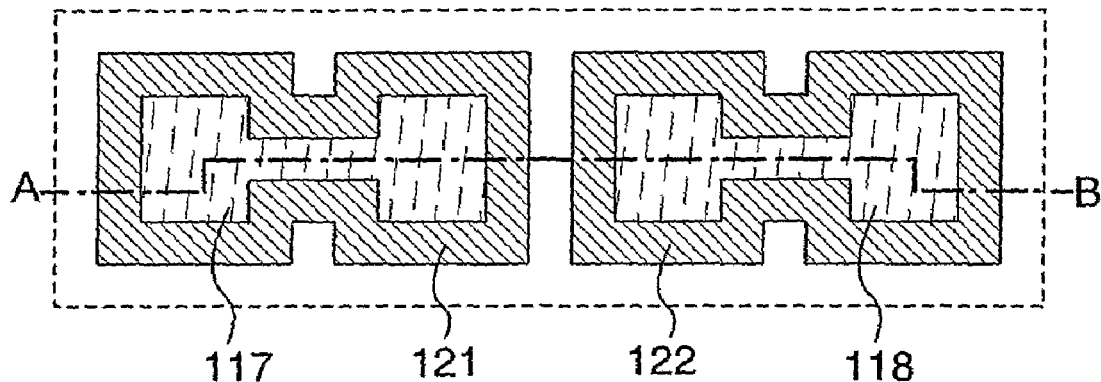
FIGS. 4A and 4B show a manufacturing method of a thin film integrated circuit according to the present invention.
Figure 5A:
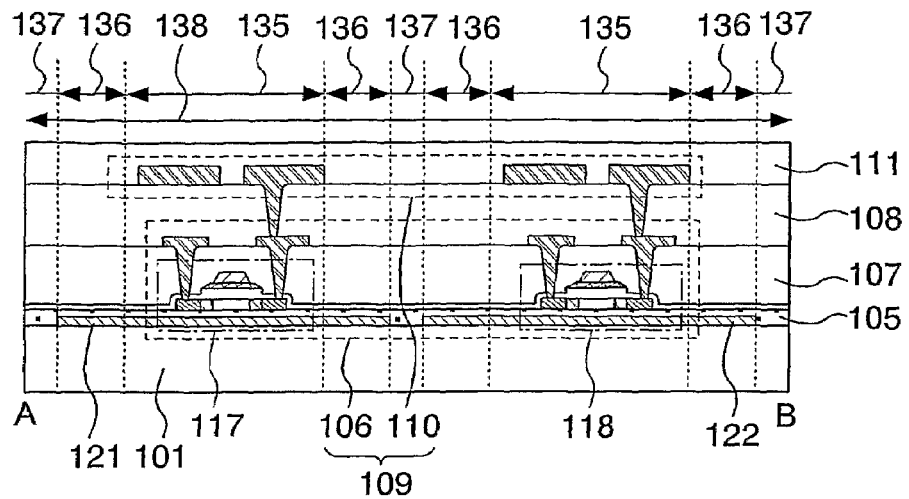
FIGS. 5A to 5D show a manufacturing method of a thin film integrated circuit according to the present invention.

An insulating film 105 is formed to be in contact with the substrate 101 and separation layers 121 and 122 (FIG. 4A and FIG. 5A). The insulating film 105 is in contact with the separation layers 121 and 122 and the substrate 101 in the third region 138 and with the substrate 101 in the fourth region 139.

Subsequently, a plurality of elements 106 including a plurality of elements is formed over the insulating film 105. Note that only active layers of the transistors 117 and 118 are shown as transistors 117 and 118 in FIGS. 4A and 4B. Here, two transistors 117 and 118 are formed in the plurality of elements 106. Then, an insulating film 107 is formed to cover the plurality of elements 106, and an insulating film 108 is formed over the insulating film 107. Then, a conductive layer serving as an antenna 110 is formed over the insulating film 108. An insulating film serving as a protective film 111 is formed over the conductive layer 110. Through the above described steps, the thin film integrated circuit 109 including the plurality of elements 106 and the conductive layer 110 is completed.

Figure 4B:
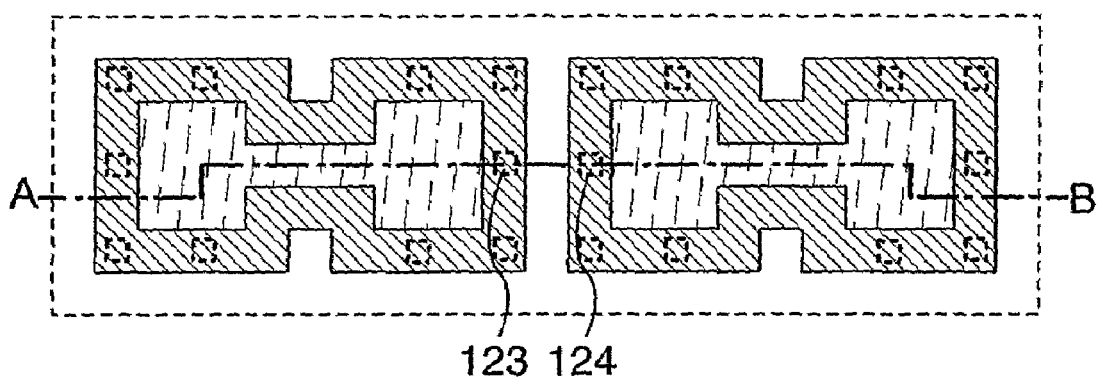
Figure 5B:
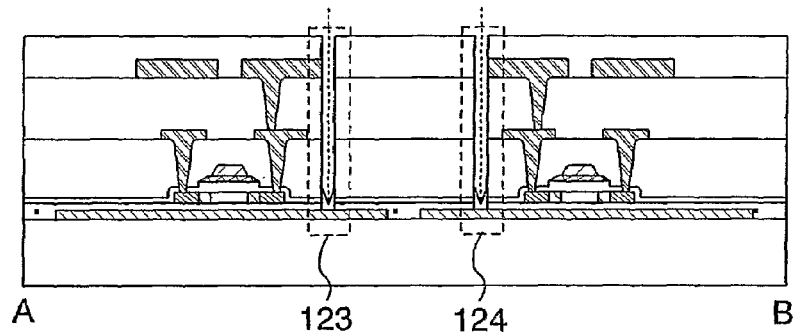

Opening portions 123 and 124 are selectively formed in the peripheral region (hereinafter, a sixth region 136) of the region where the plurality of elements 106 and the conductive layer 110 are formed (hereinafter, a fifth region 135) to expose the separation layers 121 and 122 (FIGS. 4B and 5B). In other words, the opening portions 123 and 124 are selectively formed in the periphery of the fifth region 135 where the plurality of elements 106 and the conductive layer 110 are formed.

Figure 5C:
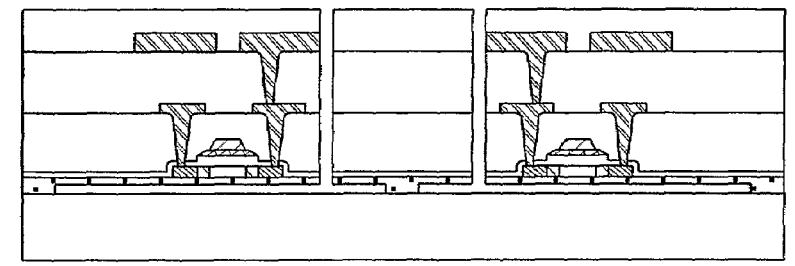

Then, an etching agent for removing the separation layers 121 and 122 is introduced into the opening portions 123 and 124 to remove the separation layers 121 and 122 (FIG. 5C). A gas or liquid containing halogen fluoride is used as the etching agent.

Figure 5D:
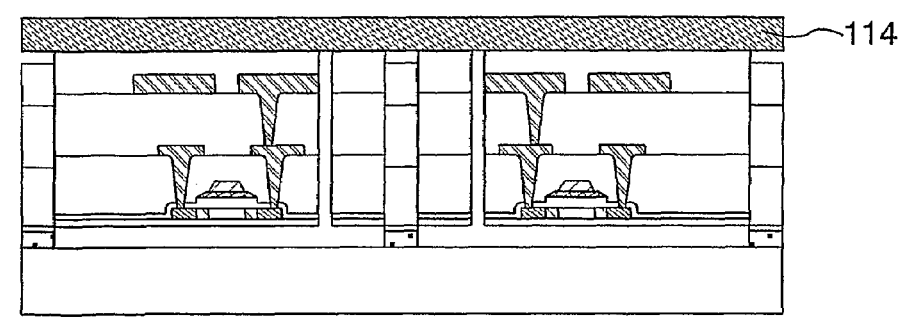

The thin film integrated circuit 109 including the plurality of elements 106 and the conductive layer 110 is attached onto a base material 114, and thus the thin film integrated circuit 109 is completely separated from the substrate 101 (FIG. 5D). At this time, a portion in which the separation layers are removed is attached onto the base material 114, while a portion in which the substrate 101 is in contact with the insulating film 105 is held by the substrate 101.

The present invention is not limited to the above described mode. When the thin film integrated circuit 109 is attached to the base material 114, the portion in which the substrate 101 is in contact with the insulating film 105 is also attached to the base material 114 and separated from the substrate 101 in some cases.

This manufacturing method has one feature that the separation layer of the seventh region 137, which exists in the third region 138 but outside the fifth region 135 and the sixth region 136, is removed but the separation layer of the fifth region 135 and the sixth region 136 are not removed, in the step of selectively removing the separation layer in the third region 138. In addition, another feature is that the opening portions are selectively provided in the sixth region 136.

In other words, the third region 138 is broadly divided into the fifth region 135, the sixth region 136 and the seventh region 137. The fifth region 135 is a region where the separation layer, the element grout 106 and the conductive layer 110 are provided, the sixth region 136 is a region where the separation layer is provided but the plurality of elements 106 and the conductive layer 110 are not provided, and the seventh region 137 is a region where none of the separation layer, the plurality of elements 106 and the conductive layer 110 are provided.

As described above, by selectively providing the separation layer, a portion of the insulating film 105 is in contact with the substrate 101, even after removing the separation layer. Therefore, the thin film integrated circuit 109 can be held by the substrate 101, and thus the thin film integrated circuit 109 can be prevented from peeling off.

A third manufacturing method is described with reference to FIGS. 6A, 6B, 7A, 7B and 8A to 8D.

A separation layer is formed on one surface of a substrate having an insulating surface 101. Then, the separation layer is selectively removed to form a third region 138 where the separation layer is selectively provided and a fourth region 139 where the separation layer is removed (FIG. 6A and FIG. 6B; the line C-D FIG. 6A corresponds to the line C-D in FIG. 6B). In the third region 138 provided selectively with the separation layer, a thin film integrated circuit is to be formed later. The fourth region 139 where the separation region is removed becomes a region where the substrate 101 is in contact with an insulating film to be formed later, without being provided with a thin film integrated circuit therein.

According to the present invention, the third region 138 and the fourth region 139 are formed separately in one thin film integrated circuit as a unit, and thus only a desired thin film integrated circuit can be transferred onto a base material. Further, since the third region 138 and the fourth region 139 are formed separately in one thin film integrated circuit as a unit, the plurality of thin film integrated circuits are each sectioned automatically by the step of transferring them onto the base material. Thus, the step of sectioning the plurality of thin film integrated circuits can be omitted.

Then, the following steps are described with reference to FIGS. 7A and 7B and 8A to 8D. The line A-B in FIGS. 6A, 7A and 7B corresponds to the line A-B in FIGS. 8A to 8D.

Figure 7A:
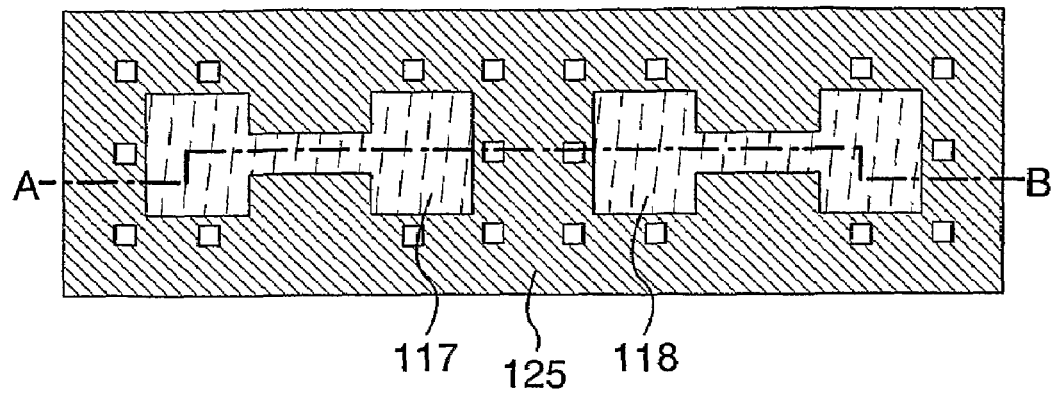
FIGS. 7A and 7B show a thin film integrated circuit according to the present invention.
Figure 8A:
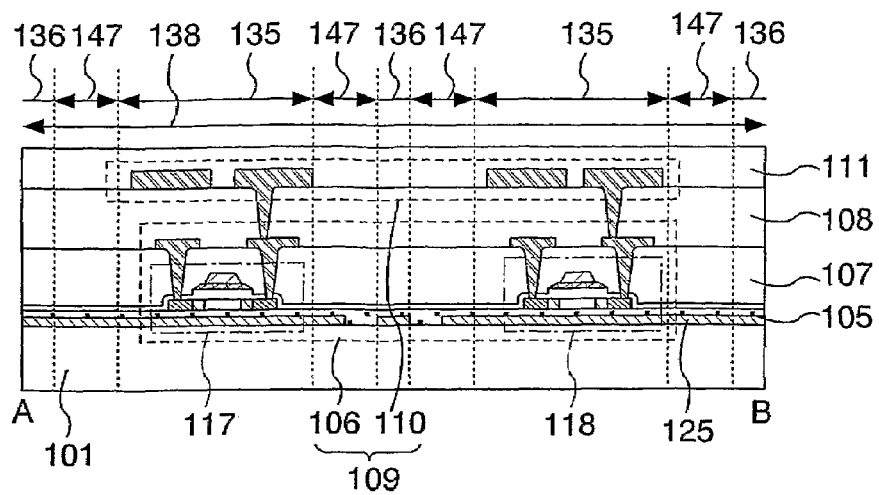
FIGS. 8A to 8D show a manufacturing method of a thin film integrated circuit according to the present invention.

An insulating film 105 is formed to be in contact with the substrate 101 and a separation layer 125 as a base film (FIG. 7A and FIG. 8A). The insulating film 105 is in contact with the separation layer 125 and the substrate 101 in the third region 138 and with the substrate 101 in the fourth region 139.

Subsequently, a plurality of elements 106 including a plurality of elements is formed over the insulating film 105. Here, two transistors 117 and 118 are formed in the plurality of elements 106. Note that only active layers of the transistors 117 and 118 are shown as transistors 117 and 118 in FIGS. 7A and 7B. Then, an insulating film 107 is formed to cover the plurality of elements 106, and an insulating film 108 is formed over the insulating film 107. Then, a conductive layer serving as an antenna 110 is formed over the insulating film 108. An insulating film serving as a protective film 111 is formed over the conductive layer 110. Through the above described steps, the thin film integrated circuit 109 including the plurality of elements 106 and the conductive layer 110 is completed.

Figure 7B:
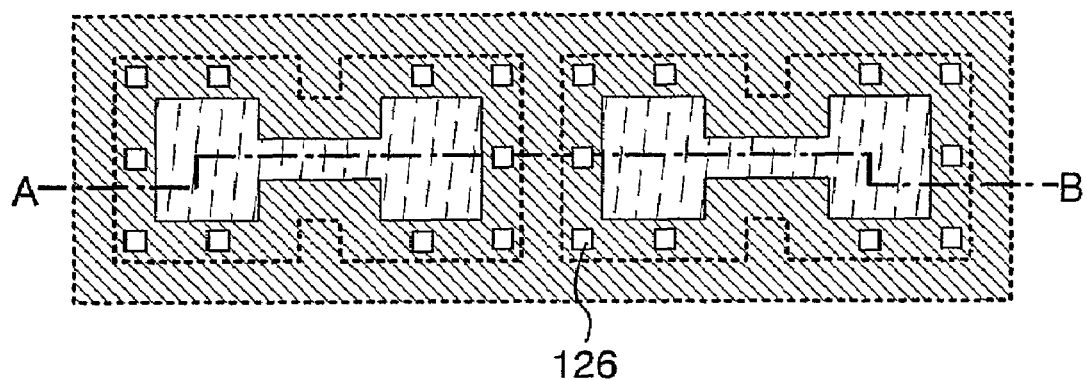
Figure 8B:
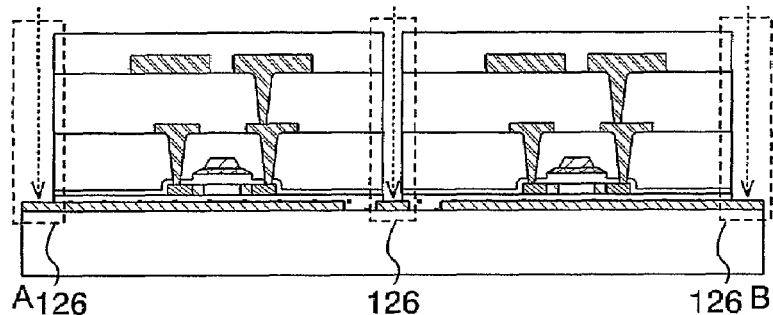

An opening portion 126 is formed in a region (hereinafter, a sixth region 136) other than the region where the plurality of elements 106 and the conductive layer 110 are formed (hereinafter, a fifth region 135) and the peripheral region of the fifth region 135 (hereinafter, a eighth region 147) to expose the separation layer 125 (FIGS. 7B and 8B). Here, the fifth region 135 is a region where the plurality of elements 106 and the conductive layer 110 are provided, the eighth region 147 is a region in the periphery of the fifth region 135, and the sixth region 136 is a region other than the fifth region 135 and eighth region 147. The sixth region 136 and the eighth region 147 are determined depending on the distance from the fifth region 135. For example, a region that exists with a certain distance from the fifth region 135 may be referred to as the eighth region 147 and the region other than the regions may be referred to as the sixth region 136.

Figure 8C:
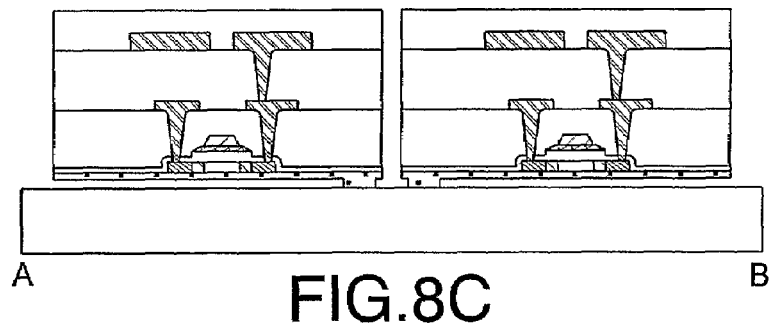

Then, an etching agent for removing the separation layer 125 is introduced into the opening portion 126 to remove the separation layer 125 (FIG. 8C). A gas or liquid containing halogen fluoride is used as the etching agent.

Figure 8D:
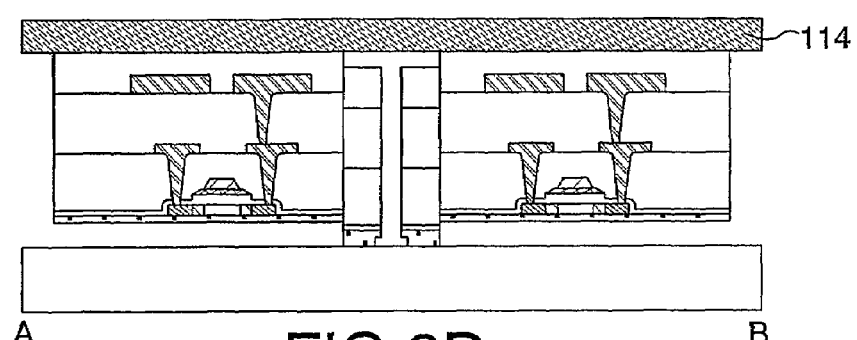

The thin film integrated circuit 109 including the plurality of elements 106 and the conductive layer 110 is attached onto a base material 114, and thus the thin film integrated circuit 109 is completely separated from the substrate 101 (FIG. 8D). At this time, a portion in which the separation layer is removed is attached onto the base material 114, while a portion in which the substrate 101 is in contact with the insulating film 105 is held by the substrate 101.

The present invention is not limited to the above described mode. When the thin film integrated circuit 109 is attached to the base material 114, the portion in which the substrate 101 is in contact with the insulating film 105 is also attached to the base material 114 and separated from the substrate 101 in some cases.

This manufacturing method has one feature that separation layer in the eighth region 14 included in the third region 138 is selectively removed but the separation layer of the fifth region 135 and the sixth region 136 are not removed, in the step of selectively removing the separation layer in the third region 138.

In other words, the third region 138 is broadly divided into the fifth region 135, the sixth region 136 and the eighth region 147. The fifth region 135 is a region where the separation layer, the element grout 106 and the conductive layer 110 are provided, the eighth region 147 is a region where the separation layer is selectively provided but the plurality of elements 106 and the conductive layer 110 are not provided, and the sixth region 136 is a region where the separation layer is provided but the plurality of elements 106 and the conductive layer 110 are not provided. The sixth region 136 is a region to be provided with an opening portion.

As described above, by selectively providing the separation layer, a portion of the insulating film 105 is in contact with the substrate 101, even after removing the separation layer. Therefore, the thin film integrated circuit 109 can be held by the substrate, and thus the thin film integrated circuit 109 can be prevented from peeling off.

A fourth manufacturing method is described with reference to FIGS. 6A, 6B, 9A to 9C and 10A to 10D.

Figure 6A:
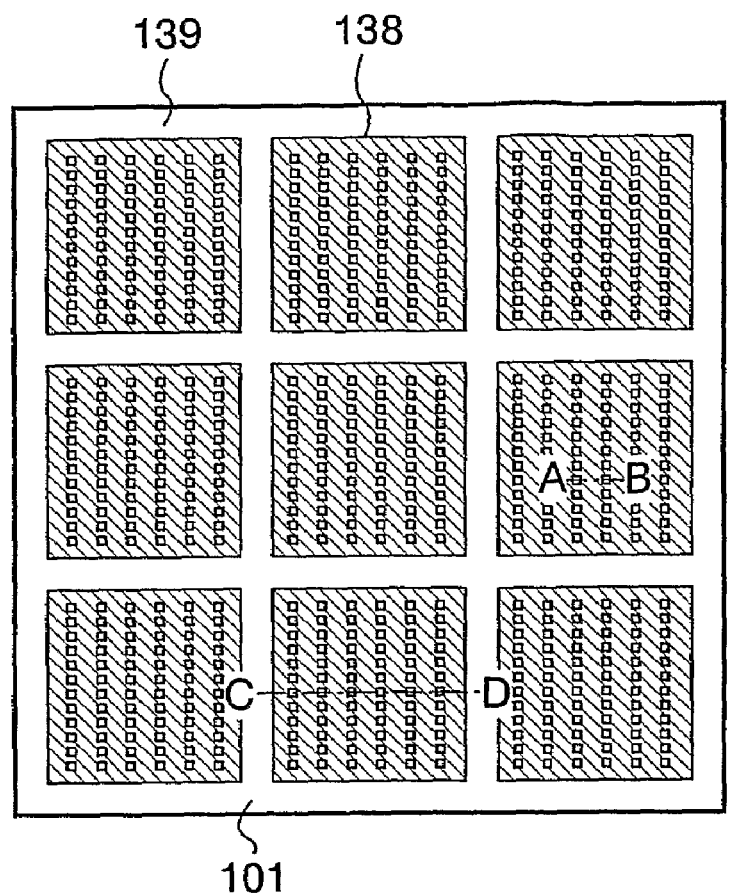
FIGS. 6A and 6B show a thin film integrated circuit according to the present invention.
Figure 6B:
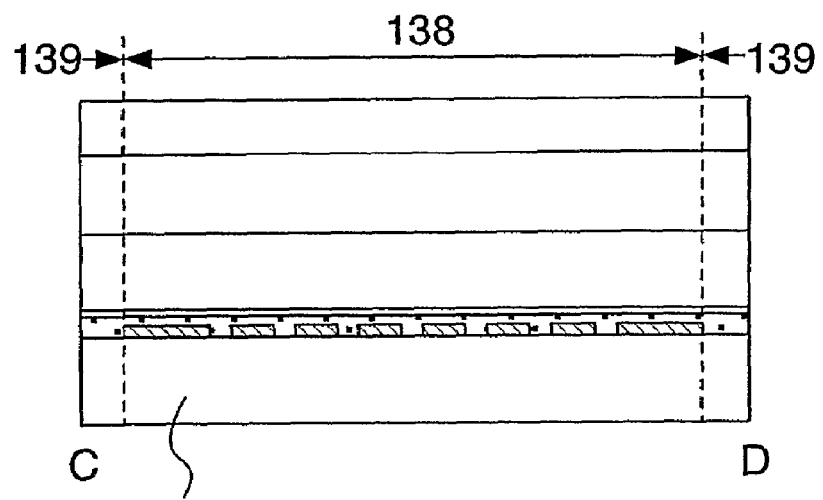

A separation layer is formed on one surface of a substrate having an insulating surface 101. Then, the separation layer is selectively removed to form a third region 138 where the separation layer is selectively provided and a fourth region 139 where the separation layer is removed (FIG. 6A and FIG. 6B). These steps are similar to those of the third manufacturing method.

Then, the following steps are described with reference to FIGS. 9A to 9C and 10A to 10D. The line A-B in FIGS. 9A to 9C corresponds to the line A-B in the cross sectional view of FIGS. 10A to 10D.

Figure 9A:
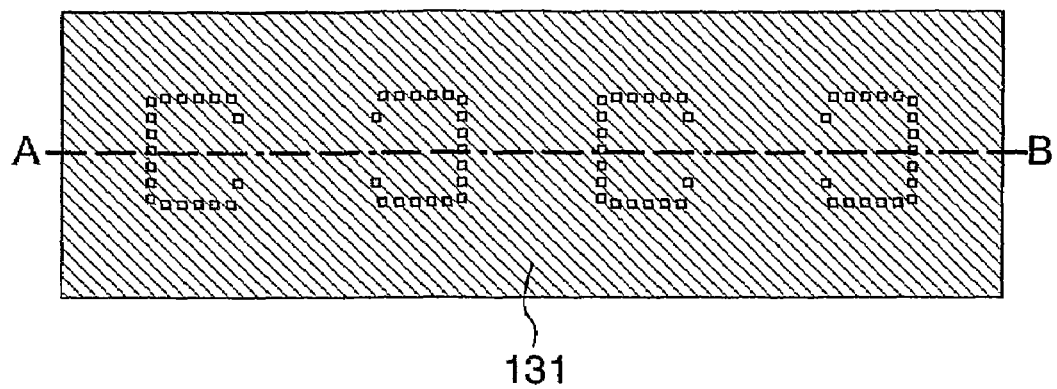
FIGS. 9A to 9C show a manufacturing method of a thin film integrated circuit according to the present invention.
Figure 9B:
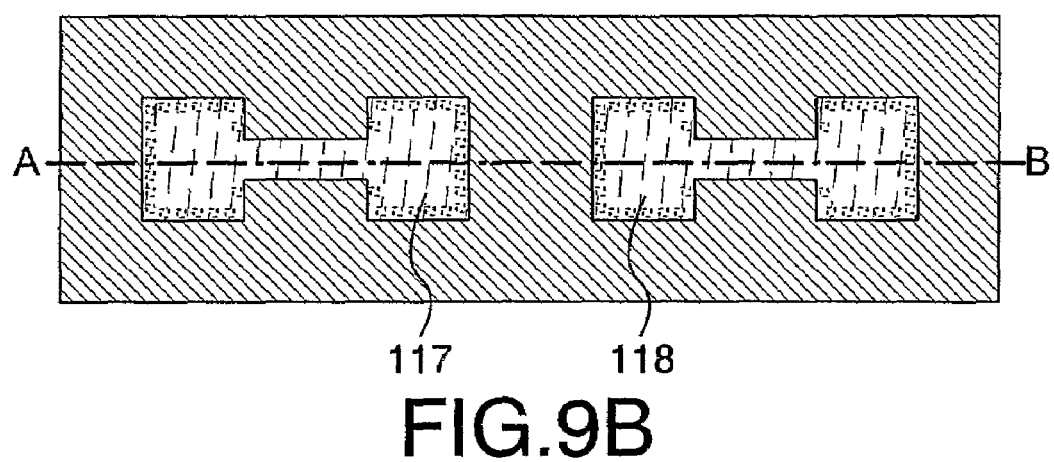
Figure 10A:
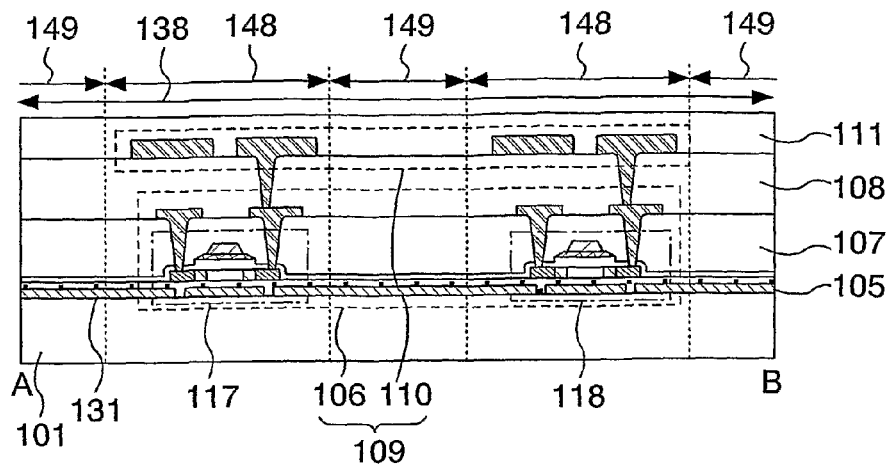
FIGS. 10A to 10D show a manufacturing method of a thin film integrated circuit according to the present invention.

An insulating film 105 is formed to be in contact with the substrate 101 and a separation layer 131 as a base film (FIG. 9B and FIG. 10A). The insulating film 105 is in contact with the separation layer 131 and the substrate 101 in the third region 138 and with the substrate 101 in the fourth region 139. In FIG. 9A, the region in which the separation layer 131 is not provided is shown by a quadrangle that is not marked with diagonal lines.

Subsequently, a plurality of elements 106 including a plurality of elements is formed over the insulating film 105. Here, two transistors 117 and 118 are formed in the plurality of elements 106. Note that only active layers of the transistors 117 and 118 are shown as transistors 117 and 118 in FIG. 9A to 9C. Then, an insulating film 107 is formed to cover the plurality of elements 106, and an insulating film 108 is formed over the insulating film 107. Then, a conductive layer serving as an antenna 110 is formed over the insulating film 108. An insulating film serving as a protective film 111 is formed over the conductive layer 110. Through the above described steps, the thin film integrated circuit 109 including the plurality of elements 106 and the conductive layer 110 is completed.

Note that in this step, a region where the substrate 101 is not in contact with the insulating film 105 is provided to overlap a region provided with the thin film integrated circuit 109. Such a region where the substrate 101 is in contact with the insulating film 105 is not separated from the substrate 101 when the thin film integrated circuit 109 is attached to the base material 114. Therefore, the area of the region where the substrate 101 is in contact with the insulating film 105 is preferably as small as possible.

Figure 9C:
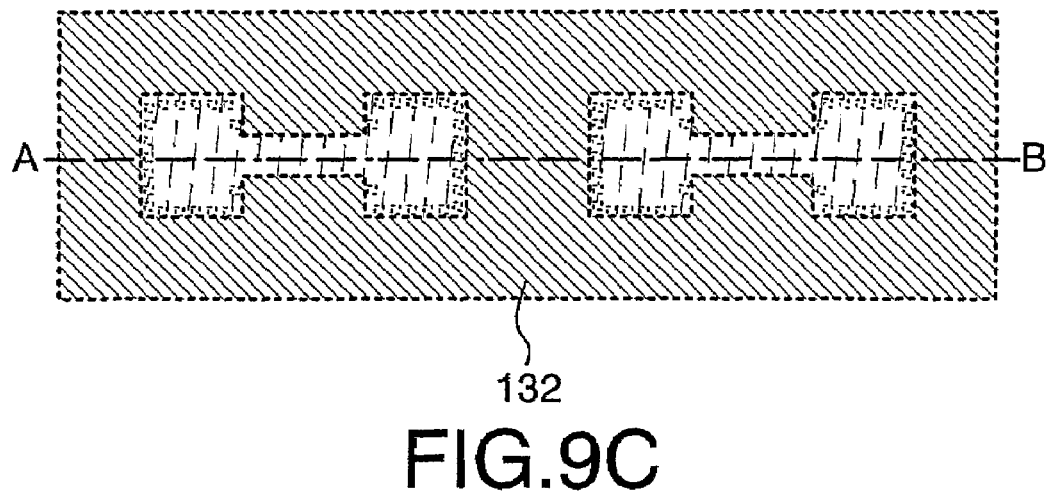
Figure 10B:
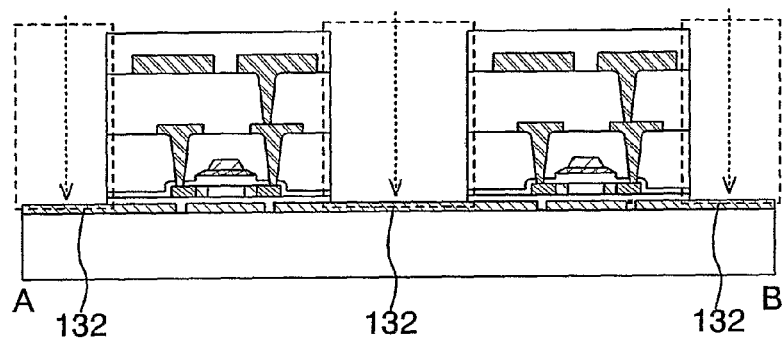

Then, an opening portion 132 is selectively formed in a region (hereinafter, the tenth region 149), which exists outside a region where the plurality of elements 106 and the conductive layer 110 are provided (hereinafter, the ninth region 148), to expose a separation layer 131 (FIGS. 9C and 10B).

Figure 10C:
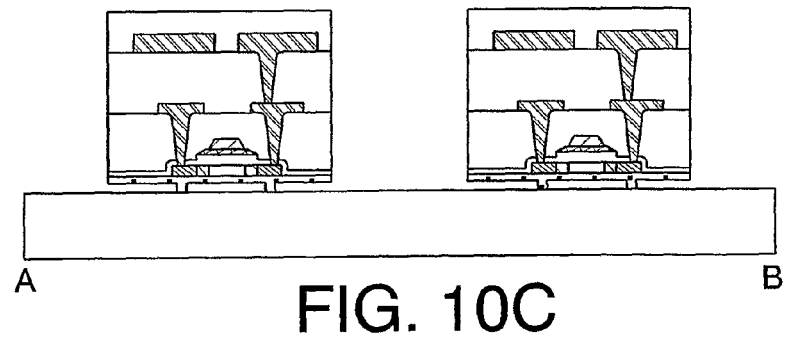

Then, an etching agent for removing the separation layer 131 is introduced into the opening portion 132 to remove the separation layer 131 (FIG. 10C). A gas or liquid containing halogen fluoride is used as the etching agent.

Figure 10D:
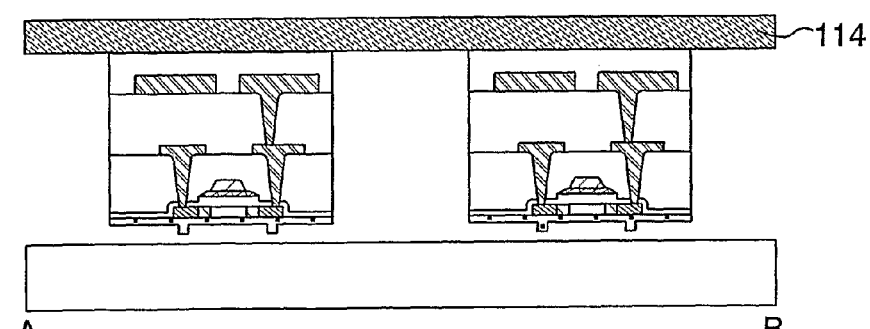

The thin film integrated circuit 109 including the plurality of elements 106 and the conductive layer 110 is attached onto a base material 114, and the thin film integrated circuit 109 is completely separated from the substrate 101 (FIG. 10D). At this time, a portion in which the substrate 101 is in contact with the insulating film 105 is also attached to the base material 114, in addition to a portion in which the separation layer is removed.

This manufacturing method has one feature that the separation layer of the fifth region 135 included in the third region 138 is selectively removed but the separation layer of the sixth region 136 is not removed in the step of selectively removing the separation layer of the third region 138.

In other words, the third region 138 is broadly divided into the ninth region 148 and the tenth region 149. The ninth region 148 is a region where the separation layer is selectively provided and the plurality of elements 106 and the conductive layer 110 are provided, and the tenth region 149 is a region where the separation layer is provided but the plurality of elements 106 and the conductive layer 110 are not provided. In addition, the tenth region 149 is a region to be provided with an opening portion.

As described above, by selectively providing the separation layer, a portion of the insulating film 105 is in contact with the substrate 101, even after removing the separation layer. Therefore, the thin film integrated circuit 109 can be held by the substrate, and thus the thin film integrated circuit 109 can be prevented from peeling off.

Figure 11A:
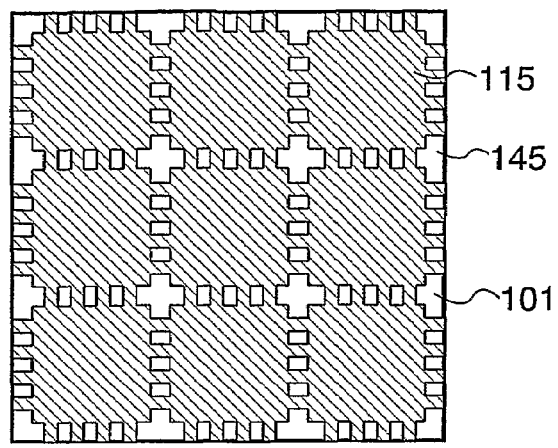
FIGS. 11A to 11C each shows an example of a layout according to the present invention.
Figure 11B:
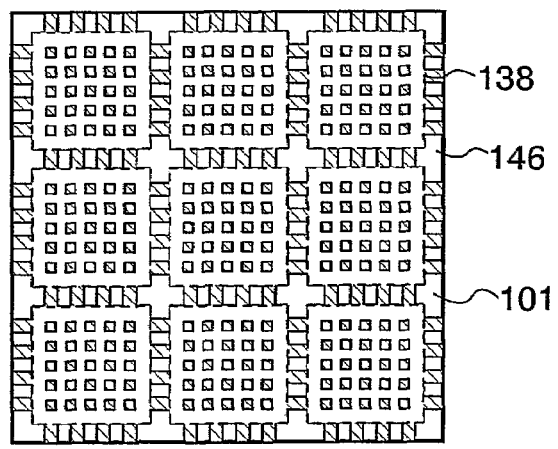
Figure 11C:
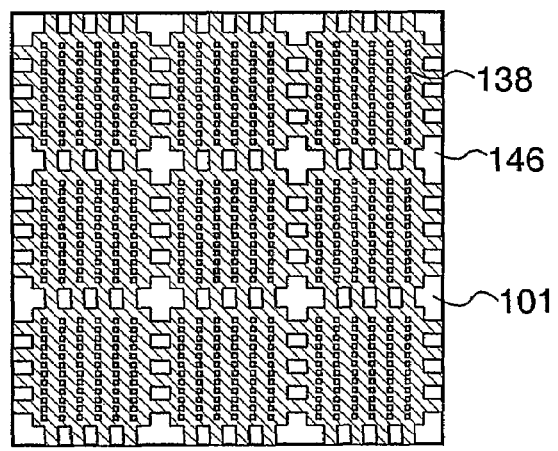

Note that in the first manufacturing method, all of the separation layers in the second regions 116 are removed; however the present invention is not limited thereto. The eleventh region 145 where separation layer is selectively removed may be formed instead of the second region 116. (FIG. 11A). In the case of the second manufacturing method, the twelfth region 146 where separation layer is selectively removed may be formed in stead of the fourth region 139 (FIG. 11B). In the case of the third and fourth manufacturing methods, the twelfth region 146 where separation layer is selectively removed may be formed in stead of the fourth region 139 (FIG. 11C).

By using the method described above, the thin film integrated circuit 109 can be held by the substrate 101 surely, and thus the thin film integrated circuit 109 can be prevented from peeling off.

The thin film integrated circuit 109 formed through the above described steps may be directly used or may be used after being sealed with a base material. Since the thin film integrated circuit 109 is formed over an insulating substrate according to the present invention, the shape of the mother substrate is not limited, as compared with a chip formed using a circular silicon substrate. Thus, productivity is enhanced to make mass-production possible, and further cost reduction can be achieved. In addition, a semiconductor film of 0.2 μm thick or less, typically 40 nm to 170 nm thick, preferably 50 nm to 150 nm thick can be used as an active region, according to the present invention. Therefore, a thin film integrated circuit becomes extremely thin, and it is difficult to gain sight of the thin film integrated circuit when it is mounted on an article. Thus, falsification can be prevented.

Embodiment 1

A thin film integrated circuit formed according to the present invention includes a plurality of elements and a conductive layer serving as an antenna. The plurality of elements are, for example, a thin film transistor, a capacitor element, a resistor element, a diode and the like.

Figure 12:
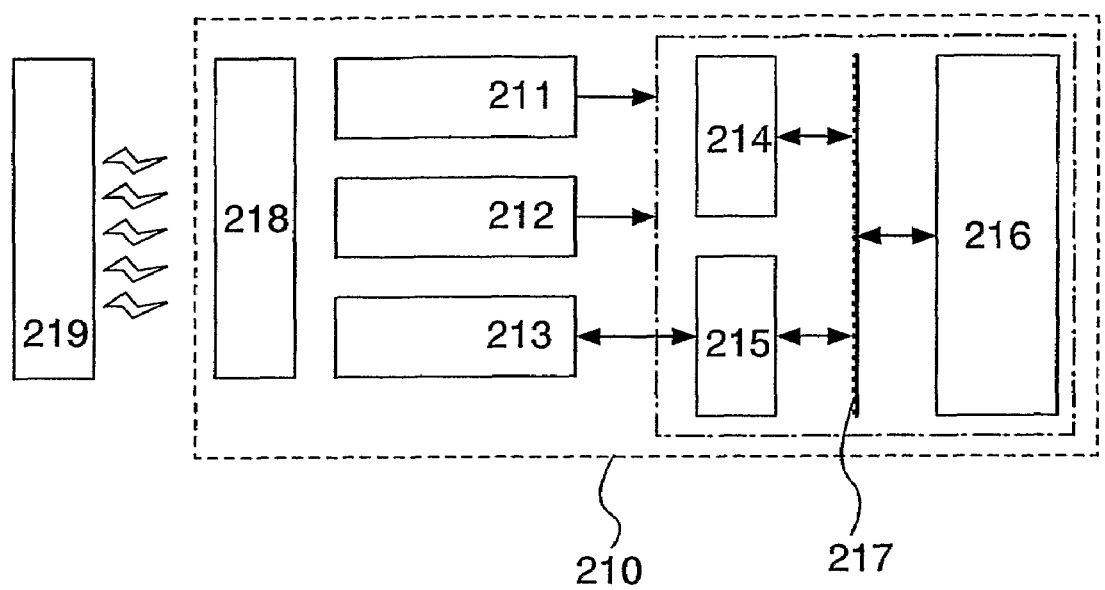
FIG. 12 shows a diagram of a thin film integrated circuit.

A thin film integrated circuit 210 includes a function of communicating data without contact, and a plurality of elements included in the thin film integrated circuit 210 form various circuits. For example, the thin film integrated circuit 210 includes a power source circuit 211, a clock generating circuit 212, a data demodulation/modulation circuit 213, a control circuit 214, an interface circuit 215, a memory 216, a data bus 217, an antenna (also referred to as an antenna coil) 218, and the like (FIG. 12).

The power source circuit 211 functions to generate power source to be supplied to the above-described respective circuits based on an alternating signal input from the antenna 218. The clock generating circuit 212 functions to generate various kinds of clock signals to be supplied to the above-described respective circuits based on an alternating signal input from the antenna 218. The data demodulation/modulation circuit 213 functions to demodulate or modulate data to be communicated with a reader/writer 219. The control circuit 214, for example, is central processing unit (CPU), micro processor unit (MPU) or the like, and functions to control other circuits. The antenna 218 functions to transmit and receive an electromagnetic field or radio waves. The reader/writer 219 controls communication with the thin film integrated circuit, control and processing of data thereof.

Note that the circuit constituted by the thin film integrated circuit is not limited to this structure, and may adopt various structures. For example, another component such as a limiter circuit of power source voltage and hardware dedicated to a code process may be additionally provided.

Embodiment 2

Figure 13A:
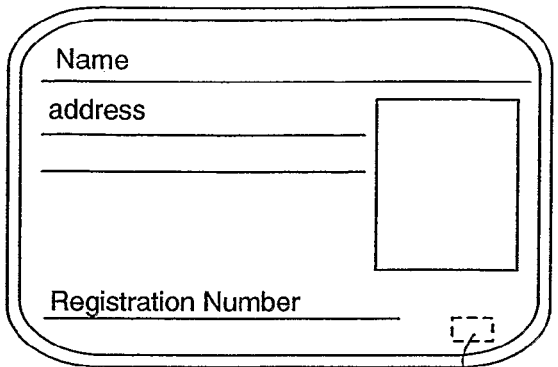
FIGS. 13A to 13E each shows an application example having a thin film integrated circuit.
Figure 13B:
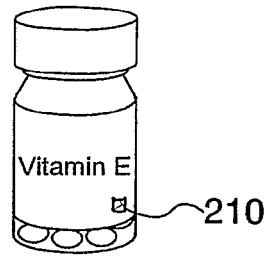
Figure 13C:
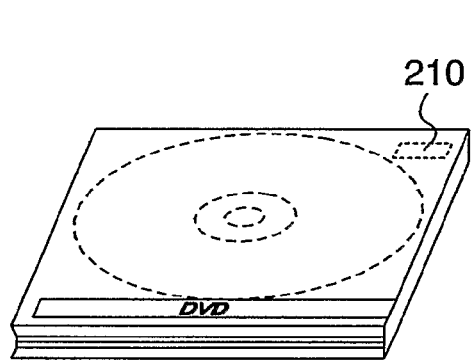
Figure 13D:
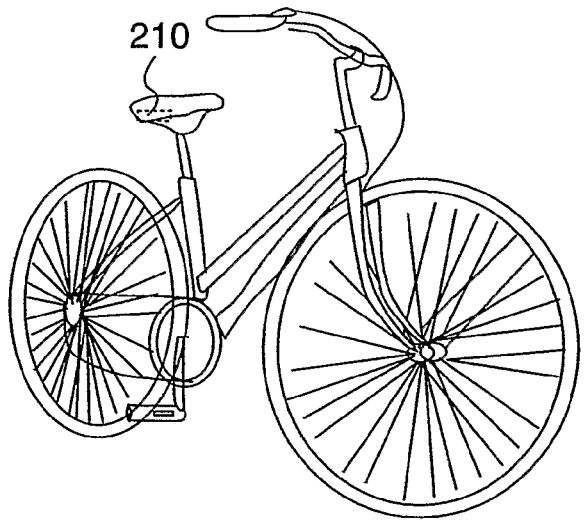
Figure 13E:
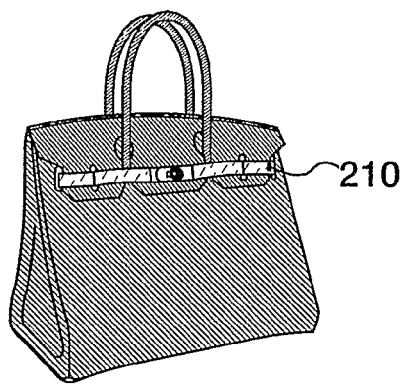

A thin film integrated circuit 210 formed according to the present invention can be applied in various fields. For example, it can be mounted on bills, coins, securities, bearer bonds, certificates (such as a driver's license and a residence card, FIG. 13A), packing containers (such as a wrapping paper and a plastic bottle, FIG. 13B), a recording medium (such as DVD soft ware and a video tape, FIG. 13C), vehicles (such as a bicycle, FIG. 13D), personal items (such as a bag and glasses, FIG. 13E), food products, clothing, commodities, electronic devices and the like. Electronic devices mean a liquid crystal display device, an EL display device, a TV set (also simply referred to as a TV, a TV receiver, a television receiver), a mobile phone and the like.

Further, the thin film integrated circuit 210 can be fixed on a product by being attached onto a surface of the product, and being mounted inside the product. For example, if a product is a book, the thin film integrated circuit 210 may be mounted inside a page of the book, and if a product is a package made from organic resin, the thin film integrated circuit 210 may be mounted inside the organic resin of the package. Counterfeiting thereof can be prevented by mounting the thin film integrated circuit 210 on bills, coins, securities, bearer bonds, certificates and the like. The efficiency of inspection system, system of rental agency and the like can be improved by mounting the thin film integrated circuit 210 on package containers, recording medium, personal items, food products, clothing, commodities, electronic devices and the like. Counterfeiting and theft thereof can be prevented by mounting the thin film integrated circuit on vehicles.

Figure 14A:
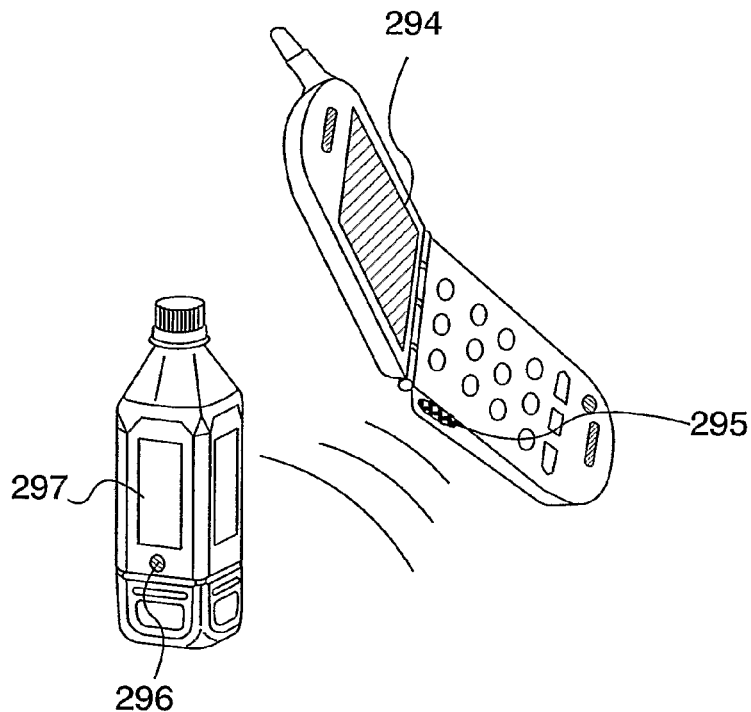
FIGS. 14A and 14B each shows an application example of a thin film integrated circuit.
Figure 14B:
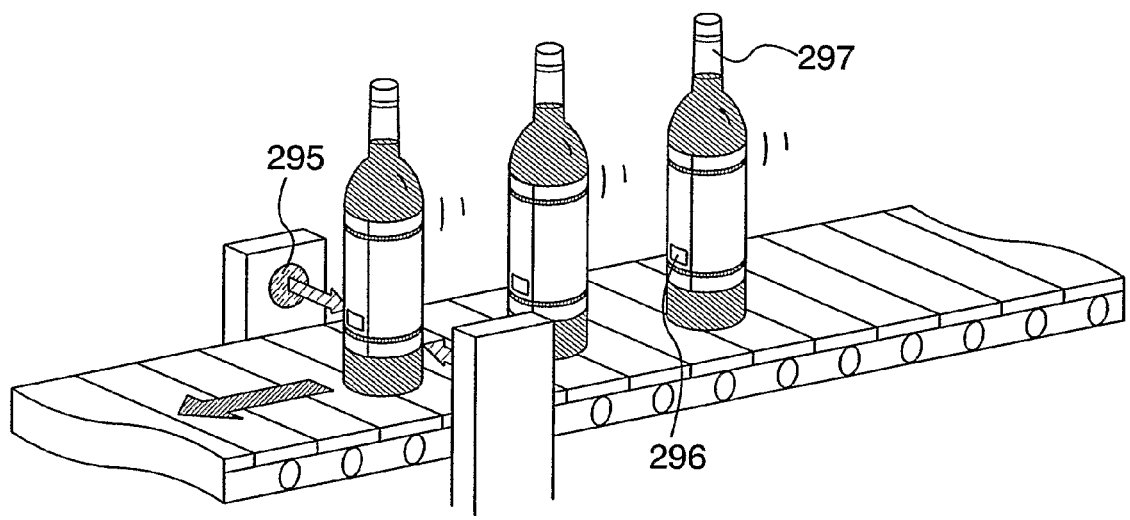

Further, higher functional system can be achieved by applying the thin film integrated circuit to product management and distribution system. For example, a reader/writer 295 is provided on a side of a portable terminal including a display portion 294 while a thin film integrated circuit 296 is provided on a side of a product 297 (FIG. 14A). In this case, when the thin film integrated circuit 296 is put close to the reader/writer 295, the display portion 294 displays information of ingredients, a place of origin and a record of the distribution process or the like on the product 297. As an another example, the reader/writer 295 can be provided beside a conveyor belt (FIG. 14B). In this case, the product 297 can be inspected easily. A multifunction system thus can be achieved by applying the thin film integrated circuit to a system.

Embodiment 3

In the above-described embodiment mode, a layer including silicon is formed as the separation layer by a known method such as sputtering or plasma CVD; however, the present invention is not limited to the layer including silicon. For example, the separation layer may be formed as a single layer or a stacked layer of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), silicon (Si), and an alloy material or a compound material that mainly contains the above mentioned elements, by a known method such as sputtering or plasma CVD.

When the separation layer has a single layer structure, a layer including tungsten, a layer including molybdenum, a layer including a mixture of tungsten and molybdenum, a layer including oxide of tungsten, a layer including nitride oxide of tungsten, a layer including oxide of molybdenum, a layer including nitride oxide of molybdenum, a layer including oxide of a mixture of tungsten and molybdenum or a layer including nitride oxide of a mixture of tungsten and molybdenum is preferably formed. Note that the mixture of tungsten and molybdenum is, for example, an alloy of tungsten and molybdenum.

When the separation layer has a stacked structure, a layer including tungsten, a layer including molybdenum or a layer including a mixture of tungsten and molybdenum is preferably formed as the first layer, and a layer including tungsten, a layer including molybdenum, a layer including oxide of a mixture of tungsten and molybdenum, a layer including nitride of a mixture of tungsten and molybdenum, a layer including nitride oxide of a mixture of tungsten and molybdenum or a layer including oxide nitride of a mixture of tungsten and molybdenum is preferably formed as the second layer.

Note that when two layers, which are a layer including tungsten and a layer including oxide of tungsten, are stacked as the separation layer, a formation method by which the layer including tungsten is formed, the layer including silicon oxide is formed thereover, and then a layer including oxide of tungsten is formed at an interface between the tungsten layer and the silicon oxide layer may be adopted. This can be applied to the case in which another stacked structure is formed. For example, when a layer including tungsten and a layer including nitride, nitride oxide or oxide nitride of tungsten are formed as a two-layer stacked structure, the layer including tungsten is formed, and then a silicon nitride layer, a silicon nitride layer including oxygen or a silicon oxide layer including nitrogen is formed thereover. This embodiment can be freely combined with embodiment mode and other embodiments.

Embodiment 4

Figure 15A:
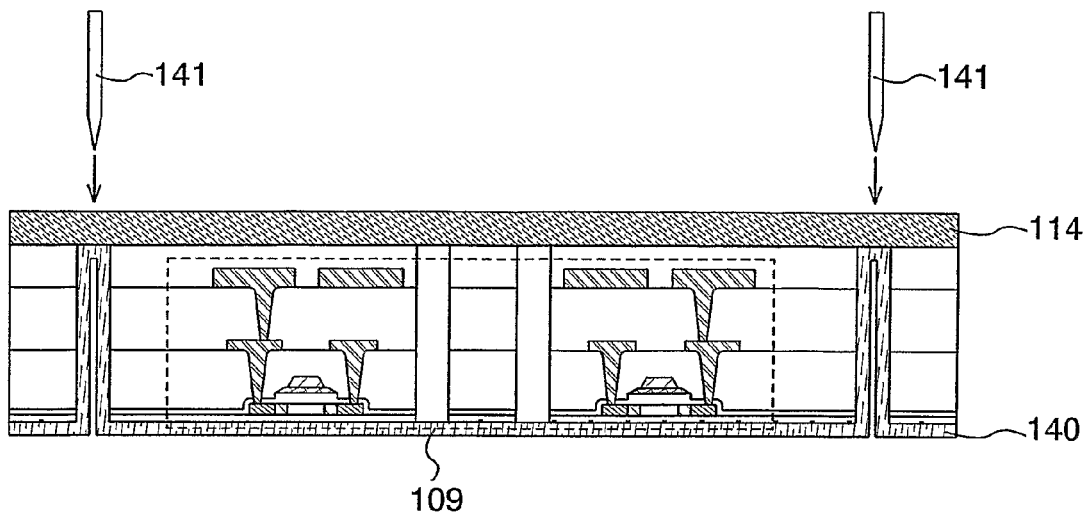
FIGS. 15A and 15B show a manufacturing method of a thin film integrated circuit according to the present invention.
Figure 15B:
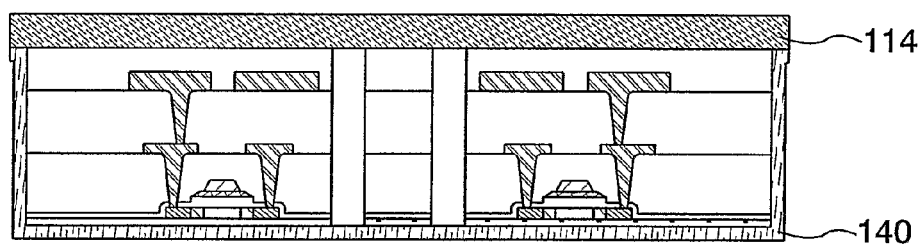

In the above-described embodiment mode, up to the process in which the thin film integrated circuit 109 is separated from the substrate 101 by attaching the thin film integrated circuit 109 onto the base material 114 is described. In this embodiment, the process thereafter is described with reference to FIGS. 15A and 15B.

After one side of the thin film integrated circuit 109 is attached onto the base material 114, the other side of the thin film integrated circuit 109 is attached onto a base material 140. After that, a portion in which the base material 114 and the base material 140 are attached to each other is cut by a cutting means 141. Consequently, one sealed thin film integrated circuit 109 is completed. The cutting means 141 is a dicing device, a scribing device, a laser irradiation device (especially, a $CO_2$ laser irradiation device), a knife or the like. Then, the sealed thin film integrated circuit 109 is shipped.

The base material 114 and the base material 140 are a film or paper made of a fibrous material. Film is made from a material such as polypropylene, polyester, vinyl, polyvinyl fluoride, vinyl chloride, ethylene-vinyl acetate or the like. Note that the surfaces of the base material 114 and the base material 140 may be coated by powder of silicon dioxide (silica). As the result of this coating, water resistance can be maintained even under a circumstance of high temperature and high humidity. Alternatively, the surfaces of the base material 114 and the base material 140 may be coated by a conductive material such as indium tin oxide. As the result of this coating, static electricity is charged, and thus the thin film integrated circuit 109 can be protected. Further, one or both of the base material 114 and the base material 140 may be coated by a thin film containing carbon as its main component (diamond like carbon film) as a protective film.

One or both of the base material 114 and the base material 140 may have an adhesive surface on one side thereof. The adhesive surface is formed by applying an adhesive agent such as thermo setting resin, ultraviolet curing resin, epoxy resin or the like. Further, one or both of the base material 114 and the base material 140 may be light-transmitting. This embodiment can be freely combined with embodiment mode and other embodiments.

Embodiment 5

In the above-described embodiment mode, the method of stacking the separation layer and the insulating film in this order over the substrate is described. For example, by the first manufacturing method, the insulating film 105 is formed to be in contact with the substrate 101 and the separation layers 102 to 104 (FIG. 2A). By the second manufacturing method, the insulating film 105 is formed to be in contact with the substrate 101 and the separation layers 121 and 122 (FIG. 5A). By the third manufacturing method, the insulating film 105 is formed to be in contact with the substrate 101 and the separation layer 125 (FIG. 8A). By the fourth manufacturing method, the insulating film 105 is formed to be in contact with the substrate 101 and the separation layer 131 (FIG. 10A). However, the present invention is not limited to these methods. A first insulating film, a separation film, a second insulating film may be stacked in this order over a substrate.

In other words, the first insulating film is formed over one surface of the substrate, and the separation layer is formed over the first insulating film. Then, the separation layer is selectively removed, and a first region in which the separation layer is provided and a second region in which the separation layer is not provided are formed. Subsequently, the second insulating film is formed over the whole surface. Specifically, the second insulating film is formed to be in contact with the separation layer in the first region and to be in contact with the first insulating film in the second region. Thus, the first insulating film, the separation layer, the second insulating film are stacked in this order over the substrate in the first region, and the first insulating film and the second insulating film are stacked in this order in the second region.

Then, a thin film integrated circuit including a plurality of elements and a conductive layer serving as an antenna is formed over the second insulating film in the first region. Subsequently, an opening portion is formed, and the separation layer is removed by introducing an etching agent to the opening portion. Consequently, a space is generated between the first insulating film and the second insulating film in the first region, whereas the substrate, the first insulating film and the second insulating film are stacked in this order to be in contact with one another in the second region.

Therefore, even after the separation layer is removed, the thin film integrated circuit provided over the second insulating film can be prevented from peeling off by providing the region in which the first insulating film and the second insulating film are in contact with each other on the substrate. Further, the thin film integrated circuit can be held by the substrate, and thus the thin film integrated circuit can be easily transferred onto a base material by providing the region in which the first insulating film and the second insulating film are in contact with each other over the substrate.

A penetration of impurities from a glass substrate can be prevented by providing the first insulating film. When the separation layer is selectively formed, it is patterned, and in this case, not only the separation layer but also the substrate is etched; however, the substrate can be prevented from being etched by forming the first insulating film. As the first insulating film, a thin film formed of silicon oxide, silicon nitride, silicon oxide to which nitrogen is added, silicon nitride to which oxygen is added or the like is formed by a known method such as plasma CVD or sputtering.

Hereinafter, a manufacturing method by which a first insulating film, a separation layer and a second insulating film are formed in this order is described.

Figure 16A:
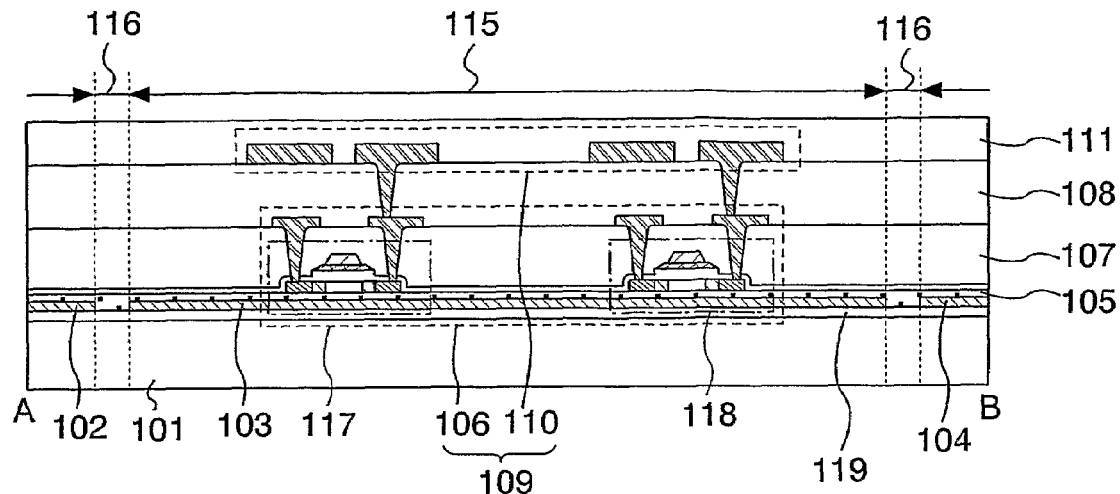
FIGS. 16A and 16B each shows a thin film integrated circuit according to the present invention.

By the first manufacturing method, an insulating film 119 (corresponding to a first insulating film) is formed over a substrate 101 (FIG. 16A). Then, separation layers 102 to 104 are selectively formed over the insulating film 119. Subsequently, an insulating film 105 (corresponding to a second insulating film) is formed to be in contact with the insulating film 119 and the separation layers 102 to 104. Consequently, the insulating film 105 is in contact with the separation layers 102 to 104 in a first region 115, and is in contact with the insulating film 119 in a second region 116. After that, as described above, a plurality of elements 106 and a conductive layer 110 serving as an antenna are formed over the insulating film 105 in the first region 115. Then opening portions in which the separation layers 102 to 104 are exposed are selectively formed in the first region 115. Then the separation layers 102 to 104 are removed by introducing an etching agent to the opening portions.

Figure 16B:
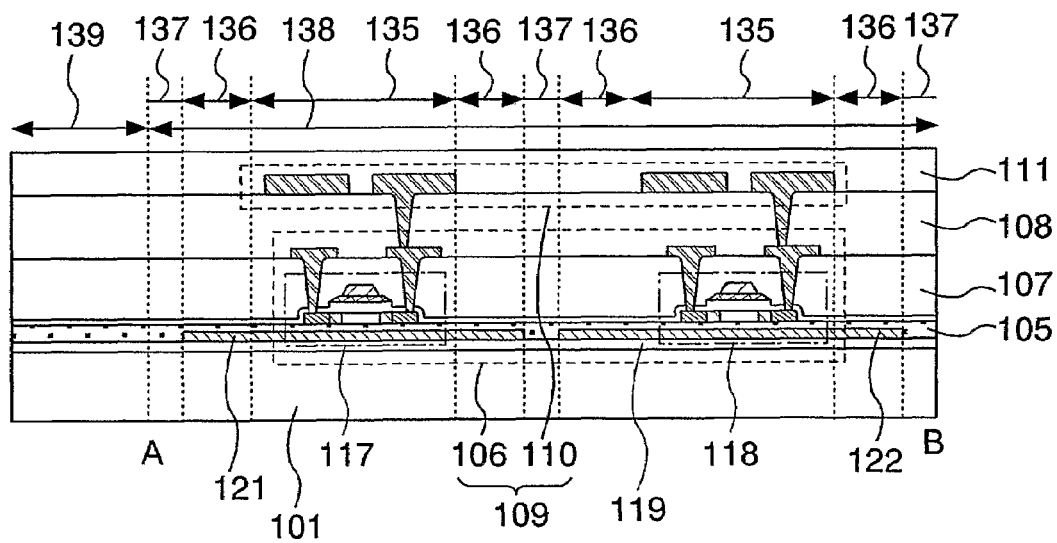

By the second manufacturing method, an insulating film 119 (corresponding to a first insulating film) is formed over a substrate 101 (FIG. 16B). Then separation layers 121 and 122 are selectively formed over the insulating film 119. Subsequently, an insulating film 105 (corresponding to a second insulating film) is formed to be in contact with the insulating film 119 and the separation layers 121 and 122. Consequently, the insulating film 105 is in contact with the separation layers 121 and 122 and the insulating film 119 in a third region 138, and is in contact with the insulating film 119 in a fourth region 139. After that, as described above, a plurality of elements 106 and a conductive layer 110 serving as an antenna are formed over the insulating film 105 in the third region 138. Then opening portions in which the separation layers 121 and 122 are exposed are selectively formed in the third region 138. Then, the separation layers 121 and 122 are removed by introducing an etching agent to the opening portions.

Figure 17A:
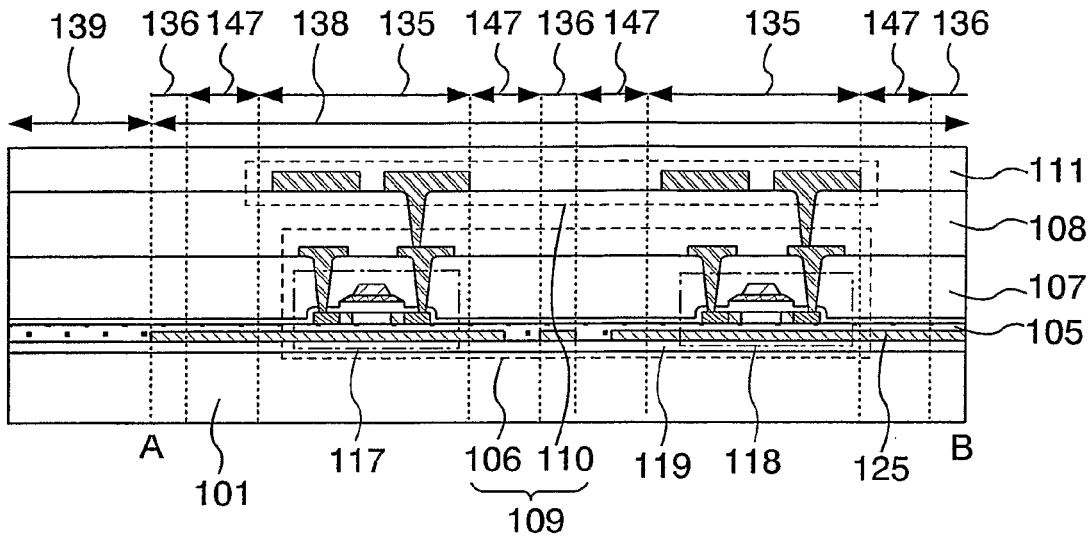
FIGS. 17A and 17B each shows a thin film integrated circuit according to the present invention.

By the third manufacturing method, an insulating film 119 (corresponding to a first insulating film) is formed on a substrate 101 (FIG. 17A). Then a separation layer 125 is selectively formed over the insulating film 119. Subsequently, an insulating film 105 (corresponding to a second insulating film) is formed to be in contact with the insulating film 119 and a separation layer 125. Consequently, the insulating film 105 is in contact with the separation layer 125 and the insulating film 119 in a third region 138, and is in contact with the insulating film 119 in a fourth region 139. After that, as described above, a plurality of elements 106 and a conductive layer 110 serving as an antenna are formed over the insulating film 105 in the third region 138. Then an opening portion in which the separation layer 125 is exposed is selectively formed in the third region 138. Then the separation layer 125 is removed by introducing an etching agent to the opening portion.

Figure 17B:
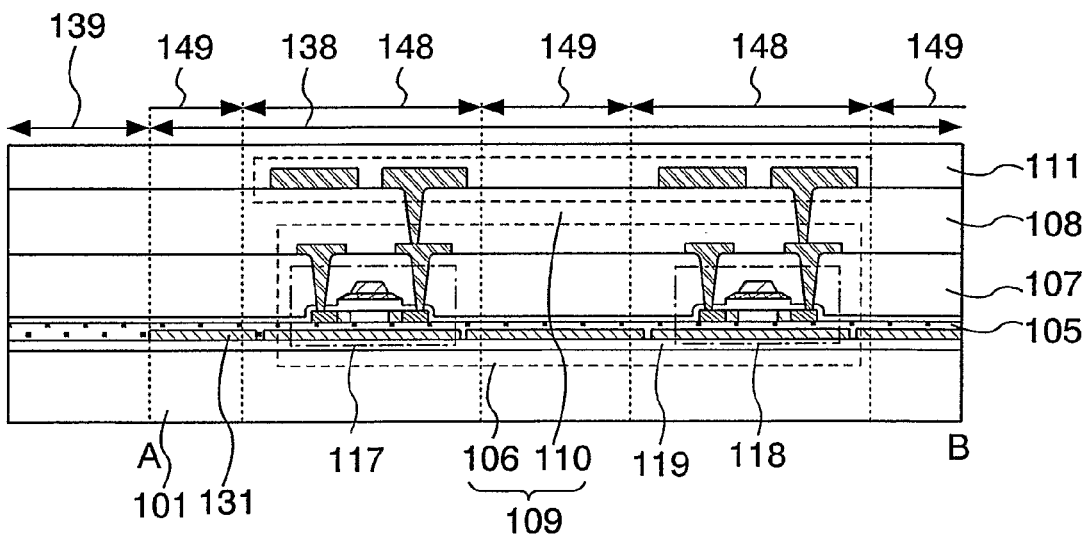

By the fourth manufacturing method, an insulating film 119 (corresponding to a first insulating film) is formed on a substrate 101 (FIG. 17B). Then, a separation layer 131 is selectively formed over the insulating film 119. Subsequently, an insulating film 105 (corresponding to a second insulating film) is formed to be in contact with the insulating film 119 and the separation layer 131. Consequently, the insulating film 105 is in contact with the separation layer 131 and the insulating film 119 in a third region 138, and is in contact with the insulating film 119 in a fourth region 139. After that, as described above, a plurality of elements 106 and a conductive layer 110 serving as an antenna are formed over the insulating film 105 in the third region 138. Then an opening portion in which the separation layer 121 is exposed is selectively formed in the third region 138. Then the separation layer 121 is removed by introducing an etching agent to the opening portion.

The invention claimed is:

1. A method for manufacturing a thin film integrated circuit, comprising the steps of:
    forming a separation layer in a first region and a second region over a substrate having an insulating surface;
    removing the separation layer in the second region;
    forming an insulating film in the first region and the second region;
    forming a plurality of transistors and a conductive layer serving as an antenna over the insulating film in the first region after the separation layer in the second region is removed;
    forming an opening portion in which the separation layer is to be exposed in the first region; and
    removing the separation layer by introducing an etching agent into the opening portion.

2. A method for manufacturing a thin film integrated circuit, comprising the steps of:
    forming a separation layer in a first region and a second region over a substrate having an insulating surface;
    removing the separation layer in the second region;
    forming an insulating film over the separation layer in the first region and the substrate in the second region;
    forming a plurality of transistors and a conductive layer serving as an antenna over the insulating film in the first region after the separation layer in the second region is removed;
    forming an opening portion in which the separation layer is to be exposed in the first region; and
    removing the separation layer by introducing an etching agent into the opening portion.

3. A method for manufacturing a thin film integrated circuit, comprising the steps of:
    forming a separation layer in a third region and a fourth region over a substrate having an insulating surface;
    selectively removing the separation layer in the third region;
    removing the separation layer in the fourth region;
    forming an insulating film in the third region and the fourth region;
    forming a plurality of elements and a conductive layer serving as an antenna over the insulating film in the third region;
    forming an opening portion in which the separation layer is to be exposed in the third region; and
    removing the separation layer by introducing an etching agent into the opening portion,
    wherein the third region comprises a fifth region in which the plurality of elements and the conductive layer are provided, a sixth region in which the opening portion is provided, and a seventh region other than the fifth region and sixth region, and
    wherein the separation layer in the fifth region and the sixth region is not removed, and the separation layer in the seventh region is removed in the step of selectively removing the separation layer.

4. A method for manufacturing a thin film integrated circuit, comprising the steps of:
    forming a separation layer in a third region and a fourth region over a substrate having an insulating surface;

selectively removing the separation layer in the third region;
removing the separation layer in the fourth region;
forming an insulating film over the substrate and the separation layer in the third region and the substrate in the fourth region;
forming a plurality of elements and a conductive layer serving as an antenna over the insulating film in the third region;
forming an opening portion in which the separation layer is to be exposed in the third region; and
removing the separation layer by introducing an etching agent into the opening portion,
wherein the third region comprises a fifth region in which the plurality of elements and the conductive layer are provided, a sixth region in which the opening portion is provided, and a seventh region other than the fifth region and sixth region, and
wherein the separation layer in the fifth region and the sixth region is not removed, and the separation layer in the seventh region is removed in the step of selectively removing the separation layer.

5. A method for manufacturing a thin film integrated circuit, comprising the steps of:
forming a separation layer in a third region and a fourth region over a substrate having an insulating surface;
selectively removing the separation layer in the third region;
removing the separation layer in the fourth region;
forming an insulating film in the third region and the fourth region;
forming a plurality of elements and a conductive layer serving as an antenna over the insulating film in the third region;
forming an opening portion in which the separation layer is to be exposed in the third region; and
removing the separation layer by introducing an etching agent into the opening portion,
wherein the third region comprises a fifth region in which the plurality of elements and the conductive layer are provided, a sixth region in which the opening portion is provided, and an eighth region other than the fifth region and sixth region, and
wherein the separation layer in the fifth region and the sixth region is not removed, and the separation layer in the eighth region is selectively removed in the step of selectively removing the separation layer.

6. A method for manufacturing a thin film integrated circuit, comprising the steps of:
forming a separation layer in a third region and a fourth region over a substrate having an insulating surface;
selectively removing the separation layer in the third region;
removing the separation layer in the fourth region;
forming an insulating film over the substrate and the separation layer in the third region and the substrate in the fourth region;
forming a plurality of elements and a conductive layer serving as an antenna over the insulating film in the third region;
forming an opening portion in which the separation layer is to be exposed in the third region; and
removing the separation layer by introducing an etching agent into the opening portion,
wherein the third region comprises a fifth region in which the plurality of elements and the conductive layer are provided, a sixth region in which the opening portion is provided, and an eighth region other than the fifth region and sixth region, and
wherein the separation layer in the fifth region and the sixth region is not removed, and the separation layer in the eighth region is selectively removed in the step of selectively removing the separation layer.

7. A method for manufacturing a thin film integrated circuit, comprising the steps of:
forming a separation layer in a third region and a fourth region over a substrate having an insulating surface;
selectively removing the separation layer in the third region;
removing the separation layer in the fourth region;
forming an insulating film in the third region and the fourth region;
forming a plurality of elements and a conductive layer serving as an antenna over the insulating film in the third region;
forming an opening portion in which the separation layer is to be exposed in the third region; and
removing the separation layer by introducing an etching agent into the opening portion,
wherein the third region comprises a ninth region in which the plurality of elements and the conductive layer are provided, and a tenth region in which the opening portion is provided, and
wherein the separation layer in the ninth region is selectively removed, and the separation layer in the tenth region is not removed in the step of selectively removing the separation layer.

8. A method for manufacturing a thin film integrated circuit, comprising the steps of:
forming a separation layer in a third region and a fourth region over a substrate having an insulating surface;
selectively removing the separation layer in the third region;
removing the separation layer in the fourth region;
forming an insulating film over the substrate and the separation layer in the third region and the substrate in the fourth region; forming a plurality of elements and a conductive layer serving as an antenna over the insulating film in the third region;
forming an opening portion in which the separation layer is to be exposed in the third region; and
removing the separation layer by introducing an etching agent into the opening portion,
wherein the third region comprises a ninth region in which the plurality of elements and the conductive layer are provided, and a tenth region in which the opening portion is provided, and
wherein the separation layer in the ninth region is selectively removed, and the separation layer in the tenth region is not removed in the step of selectively removing the separation layer.

9. The method for manufacturing the thin film integrated circuit according to any one of claims 1 to 8, wherein the etching agent is gas or liquid containing halogen fluoride.

10. The method for manufacturing the thin film integrated circuit according to any one of claims 3 to 8, wherein the plurality of elements comprise at least one of a thin film transistor, a capacitor element, a resistor element, and a diode.

* * * * *